United States Patent
Jancovich et al.

(10) Patent No.: US 12,243,548 B2
(45) Date of Patent: Mar. 4, 2025

(54) METHODS FOR REDUCING ERROR IN ENVIRONMENTAL NOISE COMPENSATION SYSTEMS

(71) Applicant: DOLBY LABORATORIES LICENSING CORPORATION, San Francisco, CA (US)

(72) Inventors: Benjamin Alexander Jancovich, Arncliffe (AU); Timothy Alan Port, Drummoyne (AU); Andrew P. Reilly, Hurlstone Park (AU); Richard J. Cartwright, Killara (AU)

(73) Assignee: DOLBY LABORATORIES LICENSING CORPORATION, San Francisco, CA (US)

( * ) Notice: Subject to any disclaimer, the term of this patent is extended or adjusted under 35 U.S.C. 154(b) by 168 days.

(21) Appl. No.: 17/781,622

(22) PCT Filed: Dec. 8, 2020

(86) PCT No.: PCT/US2020/063686
§ 371 (c)(1),
(2) Date: Jun. 1, 2022

(87) PCT Pub. No.: WO2021/118946
PCT Pub. Date: Jun. 17, 2021

(65) Prior Publication Data
US 2023/0026347 A1    Jan. 26, 2023

Related U.S. Application Data

(60) Provisional application No. 63/198,997, filed on Nov. 30, 2020, provisional application No. 63/198,999, (Continued)

(51) Int. Cl.
*G10L 21/0232* (2013.01)
*G06F 3/16* (2006.01)
(Continued)

(52) U.S. Cl.
CPC .......... *G10L 21/0232* (2013.01); *G06F 3/162* (2013.01); *G06F 3/165* (2013.01);
(Continued)

(58) Field of Classification Search
CPC ....... G10L 2021/02082; G10L 21/0208; G10L 15/22; G10L 2015/223; G10L 21/0232;
(Continued)

(56) References Cited

U.S. PATENT DOCUMENTS

| | | | |
|---|---|---|---|
| 4,559,567 A | 12/1985 | Maruichi | |
| 4,629,829 A | 12/1986 | Puhl | |

(Continued)

FOREIGN PATENT DOCUMENTS

| | | |
|---|---|---|
| CN | 103039023 A | 4/2013 |
| CN | 101911723 B | 3/2015 |

(Continued)

OTHER PUBLICATIONS

Dalskov, D., Locating Acoustic Sources with Multilateration-Applied to Stationary and Moving Sources, (Aalborg University, Jun. 4, 2014).

(Continued)

*Primary Examiner* — Lun-See Lao

(57) ABSTRACT

Some noise compensation methods involve receiving microphone signals corresponding to ambient noise from a noise source location in or near an audio environment, determining or estimating a listener position in the audio environment and estimating at least one critical distance, which is a distance from the noise source location at which directly propagated sound pressure is equal to diffuse field sound pressure. Some examples involve estimating whether the listener position is within the at least one critical distance and implementing a noise compensation method for the (Continued)

ambient noise based, at least in part, on an estimate of whether the listener position is within the critical distance.

18 Claims, 13 Drawing Sheets

Related U.S. Application Data filed on Nov. 30, 2020, provisional application No. 63/198,995, filed on Nov. 30, 2020, provisional application No. 63/198,996, filed on Nov. 30, 2020, provisional application No. 63/198,998, filed on Nov. 30, 2020, provisional application No. 62/945,292, filed on Dec. 9, 2019, provisional application No. 62/945,607, filed on Dec. 9, 2019, provisional application No. 62/945,303, filed on Dec. 9, 2019.

(51) Int. Cl.
| | | |
|---|---|---|
| G10L 15/22 | (2006.01) | |
| G10L 25/51 | (2013.01) | |
| H03G 3/32 | (2006.01) | |
| H03G 9/02 | (2006.01) | |
| H04M 9/08 | (2006.01) | |
| H04R 1/08 | (2006.01) | |
| H04R 1/40 | (2006.01) | |
| H04R 3/00 | (2006.01) | |
| H04R 3/02 | (2006.01) | |
| H04R 3/04 | (2006.01) | |
| H04R 3/12 | (2006.01) | |
| H04R 29/00 | (2006.01) | |

(52) U.S. Cl.
CPC ............. *G10L 15/22* (2013.01); *G10L 25/51* (2013.01); *H03G 3/32* (2013.01); *H03G 9/025* (2013.01); *H04M 9/082* (2013.01); *H04R 1/08* (2013.01); *H04R 1/403* (2013.01); *H04R 1/406* (2013.01); *H04R 3/005* (2013.01); *H04R 3/02* (2013.01); *H04R 3/04* (2013.01); *H04R 3/12* (2013.01); *H04R 29/001* (2013.01); *H04R 29/002* (2013.01); *G10L 2015/223* (2013.01); *H04R 2420/07* (2013.01); *H04R 2430/01* (2013.01)

(58) Field of Classification Search
CPC ...... G10L 25/51; H04M 9/082; H04R 1/1083; H04R 2227/001; H04R 2430/01; H04R 2430/03; H04R 29/001; H04R 3/007; H04R 3/02; H04R 3/04; H04R 1/08; H04R 1/403; H04R 1/406; H04R 2420/07; H04R 29/002; H04R 3/005; H04R 3/12; H04S 2400/13; H04S 7/30; H04S 7/301; H04S 7/302; H04S 7/305; H03G 3/32; H03G 9/005; H03G 9/025
USPC .................................. 381/56–59, 94.1–94.5
See application file for complete search history.

(56) References Cited

U.S. PATENT DOCUMENTS

| | | | |
|---|---|---|---|
| 5,907,622 A | 5/1999 | Dougherty | |
| 6,674,865 B1 | 1/2004 | Venkatesh | |
| 6,708,145 B1 | 3/2004 | Liljeryd | |
| 7,333,618 B2 * | 2/2008 | Shuttleworth | H04S 7/301 |
| | | | 381/57 |
| 7,519,189 B2 | 4/2009 | Bongiovi | |
| 7,760,893 B1 | 7/2010 | Felber | |
| 7,889,943 B1 | 2/2011 | Christian | |
| 8,005,231 B2 | 8/2011 | Shuttleworth | |
| 8,090,120 B2 | 1/2012 | Seefeldt | |
| 8,112,166 B2 | 2/2012 | Pavlovic | |
| 8,244,196 B2 | 8/2012 | Yang | |
| 8,285,344 B2 | 10/2012 | Kahn | |
| 8,447,045 B1 | 5/2013 | Laroche | |
| 8,565,442 B2 | 10/2013 | Maeda | |
| 8,660,281 B2 | 2/2014 | Bouchard | |
| 8,797,465 B2 | 8/2014 | Hardacker | |
| 9,076,456 B1 | 7/2015 | Avendano | |
| 9,159,335 B2 | 10/2015 | Kim | |
| 9,183,845 B1 | 11/2015 | Gopalakrishnan | |
| 9,240,176 B2 | 1/2016 | Tzirkel-Hancock | |
| 9,368,099 B2 | 6/2016 | Alderson | |
| 9,426,598 B2 | 8/2016 | Walsh | |
| 9,609,141 B2 | 3/2017 | Beaucoup | |
| 9,648,436 B2 | 5/2017 | Kraft | |
| 9,699,556 B2 | 7/2017 | Aggarwal | |
| 9,729,969 B2 | 8/2017 | Risberg | |
| 9,792,892 B2 | 10/2017 | Gul | |
| 9,842,605 B2 | 12/2017 | Lu | |
| 10,229,698 B1 | 3/2019 | Chhetri | |
| 10,242,689 B2 | 3/2019 | Chatlani | |
| 10,389,321 B2 | 8/2019 | Seefeldt | |
| 11,232,807 B2 | 1/2022 | Hines | |
| 11,587,576 B2 | 2/2023 | Hines | |
| 11,817,114 B2 * | 11/2023 | Port | H04R 3/04 |
| 2003/0028273 A1 | 2/2003 | Lydecker | |
| 2005/0013443 A1 | 1/2005 | Marumoto | |
| 2005/0260985 A1 | 11/2005 | Rader | |
| 2007/0242837 A1 | 10/2007 | Glen | |
| 2008/0137874 A1 * | 6/2008 | Christoph | H03G 3/3089 |
| | | | 381/57 |
| 2008/0247536 A1 | 10/2008 | Rahbar | |
| 2008/0269926 A1 | 10/2008 | Xiang | |
| 2010/0014683 A1 | 1/2010 | Maeda | |
| 2010/0166225 A1 | 7/2010 | Watanabe | |
| 2010/0172510 A1 | 7/2010 | Juvonen | |
| 2011/0176032 A1 | 7/2011 | Kajimura | |
| 2011/0200200 A1 | 8/2011 | Avayu | |
| 2011/0251704 A1 | 10/2011 | Walsh | |
| 2012/0133784 A1 | 5/2012 | Kajimura | |
| 2012/0230501 A1 | 9/2012 | Ganter | |
| 2012/0328114 A1 | 12/2012 | Takeuchi | |
| 2013/0054251 A1 | 2/2013 | Eppolito | |
| 2013/0315405 A1 | 11/2013 | Kanishima | |
| 2014/0112483 A1 * | 4/2014 | Etter | H03G 3/3005 |
| | | | 381/98 |
| 2014/0337016 A1 * | 11/2014 | Herbig | G10L 25/27 |
| | | | 704/201 |
| 2015/0003625 A1 | 1/2015 | Uhle | |
| 2015/0154977 A1 | 6/2015 | Ekman | |
| 2015/0205571 A1 | 7/2015 | Duwenhorst | |
| 2016/0275961 A1 | 9/2016 | Yu | |
| 2017/0245083 A1 * | 8/2017 | Kordon | G06F 3/165 |
| 2019/0066672 A1 | 2/2019 | Wood | |
| 2019/0082140 A1 | 3/2019 | Einarsson | |
| 2019/0199309 A1 | 6/2019 | Seefeldt | |
| 2019/0304431 A1 | 10/2019 | Cardinaux | |
| 2019/0371357 A1 | 12/2019 | Ramaswamy | |
| 2019/0372541 A1 | 12/2019 | Friant | |
| 2020/0092646 A1 | 3/2020 | Yamamoto | |
| 2020/0404424 A1 * | 12/2020 | Alameh | H04R 3/005 |
| 2021/0265966 A1 | 8/2021 | Port | |
| 2021/0273623 A1 | 9/2021 | Port | |
| 2022/0174368 A1 | 6/2022 | Marten | |

FOREIGN PATENT DOCUMENTS

| | | |
|---|---|---|
| CN | 104737446 A | 6/2015 |
| CN | 105679300 A | 6/2016 |
| EP | 0993670 B1 | 3/2002 |
| EP | 1414021 B1 | 5/2008 |
| EP | 1978649 A2 | 10/2008 |
| EP | 3226412 B1 | 10/2021 |
| JP | 2005006247 A | 1/2005 |
| JP | 2011528806 A | 11/2011 |
| JP | 2013532308 A | 8/2013 |
| JP | 2013247456 A | 12/2013 |
| KR | 20130038857 A | 4/2013 |

(56) References Cited

FOREIGN PATENT DOCUMENTS

| WO | 2018211908 A1 | 11/2018 |
|----|---------------|---------|
| WO | 2019209973 A1 | 10/2019 |
| WO | 2021034625 A1 | 2/2021  |

OTHER PUBLICATIONS

ISO/IEC 23003-4:2015 (MPEG-D Part 4: Dynamic Range Control) standard.

Lianga, R. et al."An Improved Method to Enhance High-Frequency Speech Intelligibility in Noise" Applied Acoustics, vol. 74, Issue 1, Jan. 2013.

Park, J.S. "Acoustic Interference cancellation for a Voice-Driven Interface in Smart TVs" IEEE vol. 59, Issue 1, Feb. 2013, pp. 244-249.

Shrawankar, U. et al."Acoustic Echo Cancellation Postfilter Design Issues For Speech Recognition System" International Journal of Science and Advanced Technology, vol. 1, No. 5, Jul. 2011, pp. 38-43.

\* cited by examiner

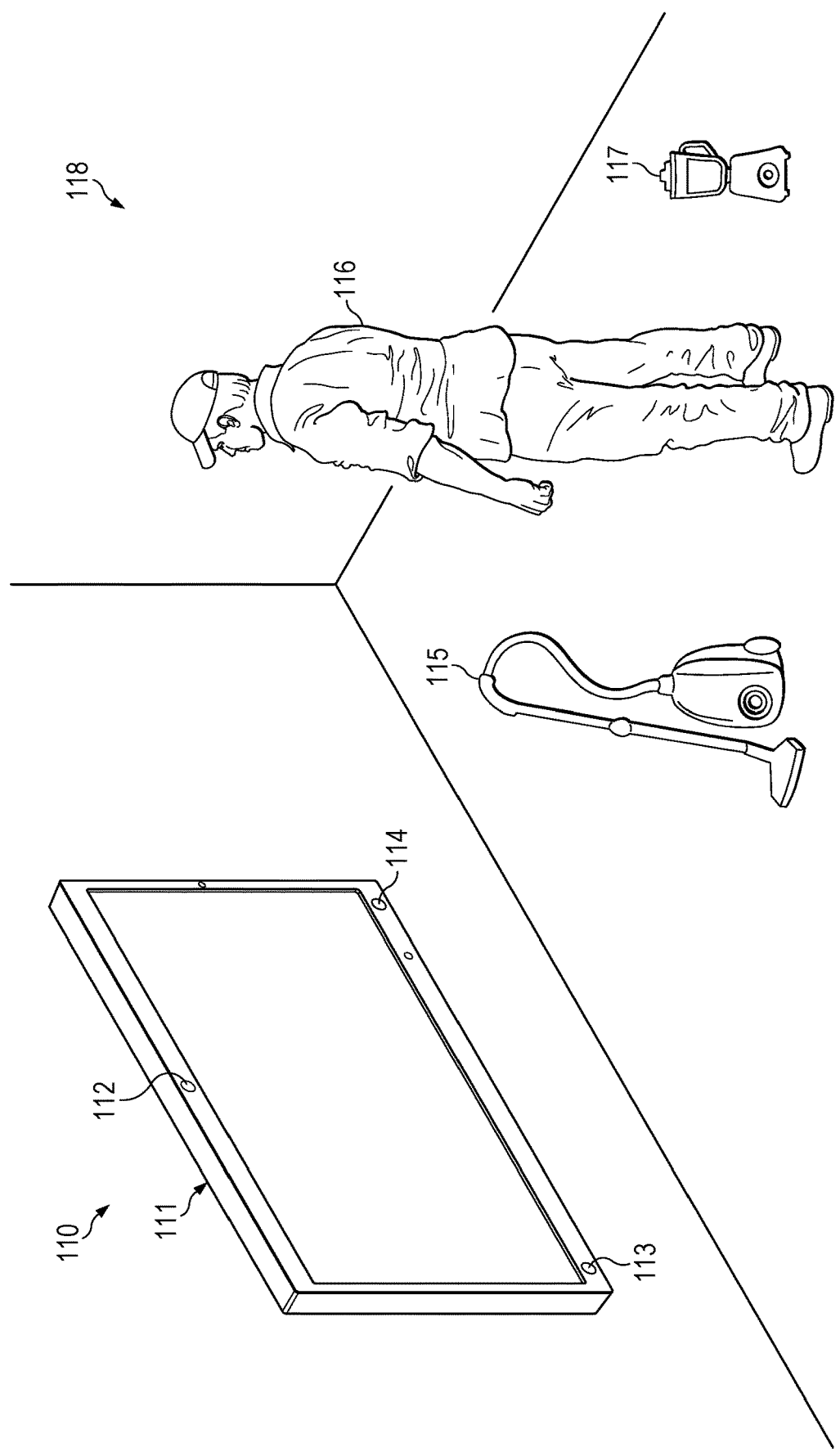

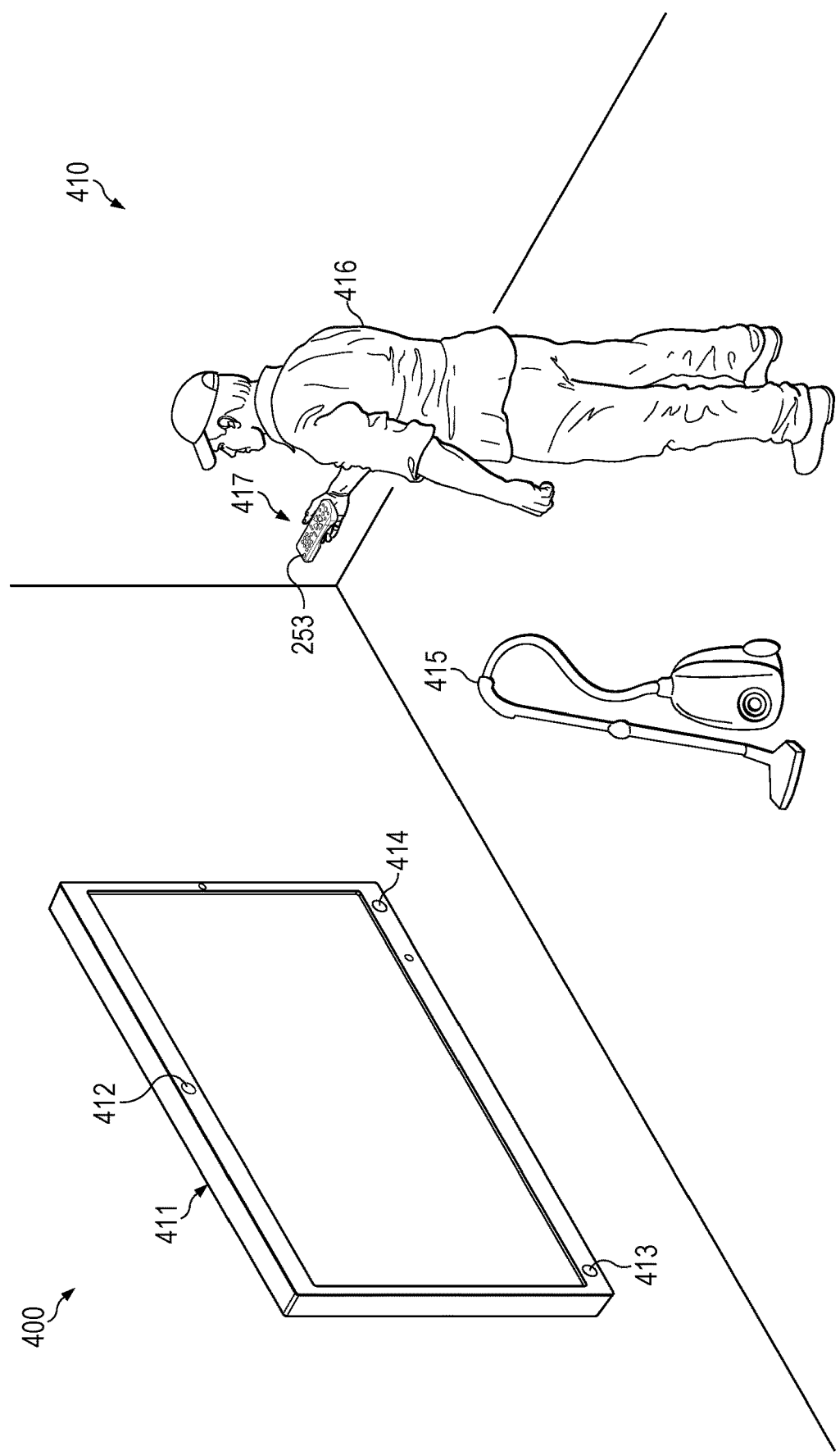

METHODS FOR REDUCING ERROR IN ENVIRONMENTAL NOISE COMPENSATION SYSTEMS

CROSS-REFERENCE TO RELATED APPLICATIONS

This application claims priority of
U.S. Provisional Patent Application No. 62/945,292, filed Dec. 9, 2019,
U.S. Provisional Patent Application No. 63/198,995, filed Nov. 30, 2020,
U.S. Provisional Patent Application No. 62/945,303, filed Dec. 9, 2019,
U.S. Provisional Patent Application No. 63/198,996, filed Nov. 30, 2020,
U.S. Provisional Patent Application No. 63/198,997, filed Nov. 30, 2020,
U.S. Provisional Patent Application No. 62/945,607, filed Dec. 9, 2019,
U.S. Provisional Patent Application No. 63/198,998, filed Nov. 30, 2020,
U.S. Provisional Patent Application No. 63/198,999, filed Nov. 30, 2020, each of which are hereby incorporated by reference in their entireties.

TECHNICAL FIELD

This disclosure pertains to systems and methods for noise compensation.

BACKGROUND

Audio and video devices, including but not limited to televisions and associated audio devices, are widely deployed. Although existing systems and methods for controlling audio and video devices provide benefits, improved systems and methods would be desirable.

NOTATION AND NOMENCLATURE

Throughout this disclosure, including in the claims, the terms "speaker," "loudspeaker" and "audio reproduction transducer" are used synonymously to denote any sound-emitting transducer (or set of transducers) driven by a single speaker feed. A typical set of headphones includes two speakers. A speaker may be implemented to include multiple transducers (e.g., a woofer and a tweeter), which may be driven by a single, common speaker feed or multiple speaker feeds. In some examples, the speaker feed(s) may undergo different processing in different circuitry branches coupled to the different transducers.

Throughout this disclosure, including in the claims, the expression performing an operation "on" a signal or data (e.g., filtering, scaling, transforming, or applying gain to, the signal or data) is used in a broad sense to denote performing the operation directly on the signal or data, or on a processed version of the signal or data (e.g., on a version of the signal that has undergone preliminary filtering or pre-processing prior to performance of the operation thereon).

Throughout this disclosure including in the claims, the expression "system" is used in a broad sense to denote a device, system, or subsystem. For example, a subsystem that implements a decoder may be referred to as a decoder system, and a system including such a subsystem (e.g., a system that generates X output signals in response to multiple inputs, in which the subsystem generates M of the inputs and the other X-M inputs are received from an external source) may also be referred to as a decoder system.

Throughout this disclosure including in the claims, the term "processor" is used in a broad sense to denote a system or device programmable or otherwise configurable (e.g., with software or firmware) to perform operations on data (e.g., audio, or video or other image data). Examples of processors include a field-programmable gate array (or other configurable integrated circuit or chip set), a digital signal processor programmed and/or otherwise configured to perform pipelined processing on audio or other sound data, a programmable general purpose processor or computer, and a programmable microprocessor chip or chip set.

Throughout this disclosure including in the claims, the term "couples" or "coupled" is used to mean either a direct or indirect connection. Thus, if a first device couples to a second device, that connection may be through a direct connection, or through an indirect connection via other devices and connections.

As used herein, a "smart device" is an electronic device, generally configured for communication with one or more other devices (or networks) via various wireless protocols such as Bluetooth, Zigbee, near-field communication, Wi-Fi, light fidelity (Li-Fi), 3G, 4G, 5G, etc., that can operate to some extent interactively and/or autonomously. Several notable types of smart devices are smartphones, smart cars, smart thermostats, smart doorbells, smart locks, smart refrigerators, phablets and tablets, smartwatches, smart bands, smart key chains and smart audio devices. The term "smart device" may also refer to a device that exhibits some properties of ubiquitous computing, such as artificial intelligence.

Herein, we use the expression "smart audio device" to denote a smart device which is either a single-purpose audio device or a multi-purpose audio device (e.g., an audio device that implements at least some aspects of virtual assistant functionality). A single-purpose audio device is a device (e.g., a television (TV)) including or coupled to at least one microphone (and optionally also including or coupled to at least one speaker and/or at least one camera), and which is designed largely or primarily to achieve a single purpose. For example, although a TV typically can play (and is thought of as being capable of playing) audio from program material, in most instances a modern TV runs some operating system on which applications run locally, including the application of watching television. In this sense, a single-purpose audio device having speaker(s) and microphone(s) is often configured to run a local application and/or service to use the speaker(s) and microphone(s) directly. Some single-purpose audio devices may be configured to group together to achieve playing of audio over a zone or user configured area.

One common type of multi-purpose audio device is an audio device that implements at least some aspects of virtual assistant functionality, although other aspects of virtual assistant functionality may be implemented by one or more other devices, such as one or more servers with which the multi-purpose audio device is configured for communication. Such a multi-purpose audio device may be referred to herein as a "virtual assistant." A virtual assistant is a device (e.g., a smart speaker or voice assistant integrated device) including or coupled to at least one microphone (and optionally also including or coupled to at least one speaker and/or at least one camera). In some examples, a virtual assistant may provide an ability to utilize multiple devices (distinct from the virtual assistant) for applications that are in a sense cloud-enabled or otherwise not completely implemented in or on the virtual assistant itself. In other words, at least some aspects of virtual assistant functionality, e.g., speech recognition functionality, may be implemented (at least in part) by one or more servers or other devices with which a virtual assistant may communication via a network, such as the Internet. Virtual assistants may sometimes work together, e.g., in a discrete and conditionally defined way. For example, two or more virtual assistants may work together in the sense that one of them, e.g., the one which is most confident that it has heard a wakeword, responds to the wakeword. The connected virtual assistants may, in some implementations, form a sort of constellation, which may be managed by one main application which may be (or implement) a virtual assistant.

Herein, "wakeword" is used in a broad sense to denote any sound (e.g., a word uttered by a human, or some other sound), where a smart audio device is configured to awake in response to detection of ("hearing") the sound (using at least one microphone included in or coupled to the smart audio device, or at least one other microphone). In this context, to "awake" denotes that the device enters a state in which it awaits (in other words, is listening for) a sound command. In some instances, what may be referred to herein as a "wakeword" may include more than one word, e.g., a phrase.

Herein, the expression "wakeword detector" denotes a device configured (or software that includes instructions for configuring a device) to search continuously for alignment between real-time sound (e.g., speech) features and a trained model. Typically, a wakeword event is triggered whenever it is determined by a wakeword detector that the probability that a wakeword has been detected exceeds a predefined threshold. For example, the threshold may be a predetermined threshold which is tuned to give a reasonable compromise between rates of false acceptance and false rejection. Following a wakeword event, a device might enter a state (which may be referred to as an "awakened" state or a state of "attentiveness") in which it listens for a command and passes on a received command to a larger, more computationally-intensive recognizer.

As used herein, the terms "program stream" and "content stream" refer to a collection of one or more audio signals, and in some instances video signals, at least portions of which are meant to be heard together. Examples include a selection of music, a movie soundtrack, a movie, a television program, the audio portion of a television program, a podcast, a live voice call, a synthesized voice response from a smart assistant, etc. In some instances, the content stream may include multiple versions of at least a portion of the audio signals, e.g., the same dialogue in more than one language. In such instances, only one version of the audio data or portion thereof (e.g., a version corresponding to a single language) is intended to be reproduced at one time.

SUMMARY

At least some aspects of the present disclosure may be implemented via one or more audio processing methods, including but not limited to content stream processing methods. In some instances, the method(s) may be implemented, at least in part, by a control system and/or via instructions (e.g., software) stored on one or more non-transitory media. Some such methods involve receiving, by a first device control system and via a first interface system of a first device in an audio environment, a content stream that includes content audio data. In some examples, the first device may be a television or a television control module.

Some such methods involve receiving, by the first device control system and via the first interface system, first microphone signals from a first device microphone system of the first device. Some such methods involve detecting, by the first device control system and based at least in part on the first microphone signals, ambient noise from a noise source location in or near the audio environment.

Some such methods involve causing, by the first device control system, a first wireless signal to be transmitted from the first device to a second device in the audio environment via the first interface system. According to some implementations, the first wireless signal may be sent via radio waves or microwaves. In some examples, the second device may be a remote control device, a smart phone or a smart speaker. The first wireless signal may include instructions for the second device to record an audio segment, e.g., via a second device microphone system. Some such methods involve receiving, by the first device control system and via the first interface system, a second wireless signal from the second device. Some such methods involve determining, by the first device control system, a content stream audio segment time interval for a content stream audio segment. According to some implementations, the second wireless signal may be sent via infrared waves.

Some such methods involve receiving, by the first device control system and via the first interface system, a third wireless signal from the second device. The third wireless signal may include a recorded audio segment captured via the second device microphone. Some such methods involve determining, by the first device control system, a second device ambient noise signal at the second device location based, at least in part, on the recorded audio segment and the content stream audio segment. Some such methods involve implementing, by the first device control system, a noise compensation method for the content audio data based, at least in part, on the second device ambient noise signal, to produce noise-compensated audio data. In some examples, the method may involve providing, by the first device control system and via the first interface system, the noise-compensated audio data to one or more audio reproduction transducers of the audio environment.

In some examples, the first wireless signal may include a second device audio recording start time or information for determining the second device audio recording start time. In some instances, the second wireless signal may indicate a second device audio recording start time. According to some examples, the method may involve receiving, by the first device control system and via the first interface system, a fourth wireless signal from the second device. The fourth wireless signal may, in some examples, indicate a second device audio recording end time. According to some examples, the method may involve determining a content stream audio segment end time based on the second device audio recording end time. In some instances, the first wireless signal may indicate a second device audio recording time interval.

According to some examples, the method may involve receiving, by the first device control system and via the first interface system, second microphone signals from the first device microphone system, e.g., during a second device audio recording time interval. In some examples, the method may involve detecting, by the first device control system and based at least in part on the first microphone signals, a first device ambient noise signal corresponding to the ambient noise from the noise source location. The noise compensation method may be based, at least in part, on the first device ambient noise signal. In some examples, the noise compensation method may be based, at least in part, on a comparison of the first device ambient noise signal and the second device ambient noise signal. According to some examples, the noise compensation method may be based, at least in part, on a ratio of the first device ambient noise signal and the second device ambient noise signal.

According to some examples, the method may involve rendering, by the first device control system, the noise-compensated audio data to produce rendered audio signals, and providing, by the first device control system and via the first interface system, the rendered audio signals to at least some audio reproduction transducers of a set of audio reproduction transducers of the audio environment. In some implementations, at least one of the reproduction transducers of the audio environment may reside in the first device.

At least some alternative aspects of the present disclosure may be implemented via one or more audio processing methods, including but not limited to content stream processing methods. In some instances, the method(s) may be implemented, at least in part, by a control system and/or via instructions (e.g., software) stored on one or more non-transitory media. Some such methods involve receiving, by a control system and via an interface system, microphone signals corresponding to ambient noise from a noise source location in or near an audio environment. Some such methods involve determining or estimating, by the control system, a listener position in the audio environment. Some such methods involve estimating, by the control system, at least one critical distance, a critical distance being a distance from the noise source location at which directly propagated sound pressure is equal to diffuse field sound pressure. Some such methods involve estimating whether the listener position is within the at least one critical distance and implementing a noise compensation method for the ambient noise based, at least in part, on at least one estimate of whether the listener position is within the at least one critical distance.

Some such methods may involve controlling, via the control system, an audio reproduction transducer system in an audio environment to reproduce one or more room calibration sounds, the audio reproduction transducer system including one or more audio reproduction transducers. In some examples, the one or more room calibration sounds may be embedded in content audio data received by the control system. Some such methods may involve receiving, by the control system and via the interface system, microphone signals corresponding to the audio environment's response to the one or more room calibration sounds and determining, by the control system and based on the microphone signals, a reverberation time for each of a plurality of frequencies. Some such methods may involve determining or estimating an audio environment volume of the audio environment.

According to some examples, estimating the at least one critical distance may involve calculating, based at least in part on the plurality of frequency-dependent reverberation times and the audio environment volume, a plurality of estimated frequency-based critical distances. In some examples, each estimated frequency-based critical distance of the plurality of estimated frequency-based critical distances may correspond to a frequency of the plurality of frequencies. In some examples, estimating whether the listener position is within the at least one critical distance may involve estimating whether the listener position is within each frequency-based critical distance of the plurality of frequency-based critical distances. According to some examples, the method may involve transforming the microphone signals corresponding to the ambient noise from a time domain into a frequency domain and determining a frequency band ambient noise level estimate for each of a plurality of ambient noise frequency bands. According to some examples, the method may involve determining a frequency-based confidence level for each of the frequency band ambient noise level estimates. Each frequency-based confidence level may, for example, correspond to an estimate of whether the listener position is within each frequency-based critical distance. In some implementations, each frequency-based confidence level may be inversely proportional to each frequency-based critical distance.

In some examples, implementing the noise compensation method may involve implementing a frequency-based noise compensation method based on the frequency-based confidence level for each ambient noise frequency band. In some instances, the frequency-based noise compensation method may involve applying a default noise compensation method for each ambient noise frequency band for which the confidence level is at or above a threshold confidence level. According to some implementations, the frequency-based noise compensation method may involve modifying a default noise compensation method for each ambient noise frequency band for which the confidence level is below a threshold confidence level. Modifying the default noise compensation method may, for example, involve reducing a default noise compensation level adjustment.

According to some examples, the method may involve receiving, by the control system and via the interface system, a content stream that includes audio data. In some such examples, implementing the noise compensation method may involve applying the noise compensation method to the audio data to produce noise-compensated audio data. In some examples, the method may involve providing, by the control system and via the interface system, the noise-compensated audio data to one or more audio reproduction transducers of the audio environment.

In some examples, the method may involve rendering, by the control system, the noise-compensated audio data to produce rendered audio signals and providing, by the control system and via the interface system, the rendered audio signals to at least some audio reproduction transducers of a set of audio reproduction transducers of the audio environment.

Some or all of the operations, functions and/or methods described herein may be performed by one or more devices according to instructions (e.g., software) stored on one or more non-transitory media. Such non-transitory media may include memory devices such as those described herein, including but not limited to random access memory (RAM) devices, read-only memory (ROM) devices, etc. Accordingly, some innovative aspects of the subject matter described in this disclosure can be implemented via one or more non-transitory media having software stored thereon.

At least some aspects of the present disclosure may be implemented via apparatus. For example, one or more devices may be capable of performing, at least in part, the methods disclosed herein. In some implementations, an apparatus is, or includes, an audio processing system having an interface system and a control system. The control system may include one or more general purpose single- or multi-chip processors, digital signal processors (DSPs), application specific integrated circuits (ASICs), field programmable gate arrays (FPGAs) or other programmable logic devices, discrete gates or transistor logic, discrete hardware components, or combinations thereof.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

FIG. 1B shows another example of a noise compensation system.

FIGS. 4A and 4B shows additional examples of noise compensation system components.

Like reference numbers and designations in the various drawings indicate like elements.

DETAILED DESCRIPTION OF EMBODIMENTS

Noise compensation systems are configured to compensate for environmental noise, e.g., ambient noise, within an audio environment. As used herein, the terms "ambient noise" and "environmental noise" refer to noise produced by one or more noise sources that are external to an audio playback system and/or a noise compensation system. The audio environment may, in some examples, be a home audio environment, e.g., one or more rooms of a home. In other examples, the audio environment may be another type of environment, such as an office environment, an automobile environment, a train environment, a street or sidewalk environment, a park environment, etc.

Figure 1A:
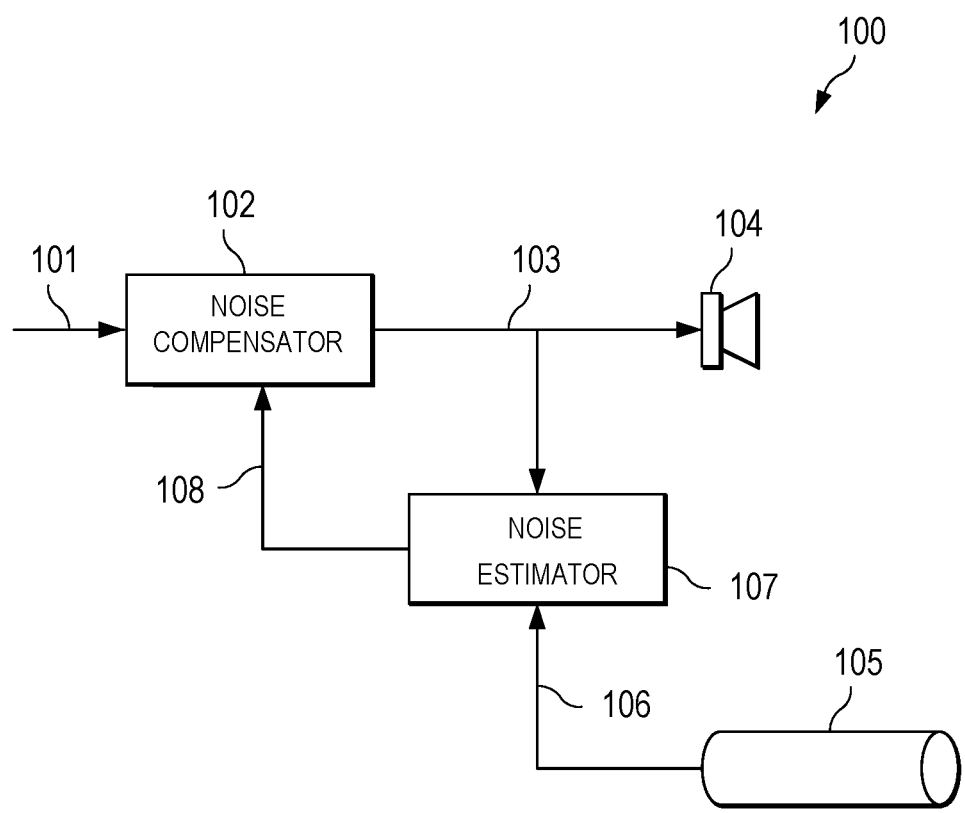
FIG. 1A is a block diagram that shows an example of a noise compensation system.

FIG. 1A shows an example of a noise compensation system. In this example, the noise compensation system 100 is configured to adjust the level of the input audio signal 101 based upon a noise estimate 108. According to this example, the noise compensation system 100 includes a loudspeaker 104, a microphone 105, a noise estimator 107 and a noise compensator 102. In some examples, the noise estimator 107 and the noise compensator 102 may be implemented via a control system (such as the control system 210 that is described below with reference to FIG. 2), e.g., according to instructions stored on one or more non-transitory storage media. As noted above, the terms "speaker," "loudspeaker" and "audio reproduction transducer" are used synonymously herein. As with other figures provided herein, the types, numbers and arrangements of elements shown in FIG. 1A are merely provided by way of example. Other implementations may include more, fewer and/or different types, numbers or arrangements of elements, e.g., more loudspeakers.

In this example, the noise compensator 102 is configured to receive an audio signal 101 from a file, a streaming service, etc. The noise compensator 102 may, for example, be configured to apply a gain adjustment algorithm, such as a frequency-dependent gain adjustment algorithm or a broadband gain adjustment algorithm.

In this example, the noise compensator 102 is configured to send a noise-compensated output signal 103 to the loudspeaker 104. According to this example, the noise-compensated output signal 103 is also provided to, and is a reference signal for, the noise estimator 107. In this example, microphone signals 106 are also sent to the noise estimator 107 from the microphone 105.

According to this example, the noise estimator 107 is a component that is configured to estimate the level of noise in an environment that includes the system 100. The noise estimator 107 may be configured to receive the microphone signals 106 and to calculate how much of the microphone signals 106 consist of noise and how much is due to the playback of the loudspeaker 104. The noise estimator 107 may, in some examples, include an echo canceller. However, in some implementations the noise estimator 107 may simply measure the noise when a signal corresponding with silence (a "quiet playback interval") is sent to the loudspeaker 104. In some such examples, the quiet playback intervals may be instances of audio signals at or below a threshold level in one or more frequency bands. Alternatively, or additionally, in some examples the quiet playback intervals may be instances of audio signals at or below a threshold level during a time interval.

In this example, the noise estimator 107 is providing a noise estimate 108 to the noise compensator 102. The noise estimate 108 may be a broadband estimate or a spectral estimate of the noise, depending on the particular implementation. In this example, the noise compensator 102 is configured to adjust the level of the output of the loudspeaker 104 based upon the noise estimate 108.

The loudspeakers of some devices, such as mobile devices, often have rather limited capabilities. Accordingly, the type of volume adjustment provided by the system 100 will be generally limited by the dynamic range and/or the speaker protection components (e.g., limiters and/or compressors) of such loudspeakers. Noise compensation systems such as the noise compensation system 100 may apply gains that are either frequency-dependent gains or broadband gains.

While not yet commonplace in the consumer electronics market, the utility of onboard microphones in home entertainment devices to measure and compensate for background noise has been demonstrated. The primary reason for the lack of adoption of this functionality relates to a problem that this document will refer to as "noise source proximity ambiguity," as the "proximity ambiguity problem" or simply as the "proximity problem." In the simplest sense, this problem arises due to the fact that sound pressure level (SPL) is a measured property that quantifies "how much sound there is" at a specific point in space.

Because acoustic waves lose energy as they propagate through a medium, a measurement made at one point in space is meaningless for all other points without prior knowledge of the distance between those points, as well as some properties of the transmission medium, in this case, air at room temperature. In anechoic spaces, these propagation losses are simple to model by an inverse square law. This inverse square law does not hold true for reverberant (real) rooms, so ideally, to model propagation, the reverberation characteristics of the physical space are also known.

The proximity of the noise source to the listener is an important factor in determining the detrimental impact of the noise from that noise source on content audibility and intelligibility for the listener. A measurement of sound pressure level via a microphone at an arbitrary location, such as on the housing of a television, is not sufficient for determining the detrimental impact of the noise for the listener, because this microphone may see an identical sound pressure level for a very loud but distant noise source as for a quiet, nearby source.

The present disclosure provides various methods that can overcome at least some of these potential drawbacks, as well as devices and systems for implementing the presently-disclosed methods. Some disclosed implementations involve measuring the SPL of the ambient noise at a listener position. Some disclosed implementations involve inferring the noise SPL at a listener position from the level detected at an arbitrary microphone location, by knowing (or inferring) the proximity of listener and noise source to the microphone location. Various examples of the foregoing implementations are described below with reference to FIG. 4 et seq.

Some alternative implementations involve predicting (e.g., on a per-frequency basis), how much error is likely to occur in an ambient noise estimate that does not involve a solution the noise source proximity ambiguity problem. Some examples are described below with reference to FIGS. 1B-3B.

If the system does not implement one of the solutions described in the foregoing paragraphs, some disclosed noise compensation methods may apply level adjustments to the device's output that result in the content reproduction being either too loud or too quiet to the listener.

FIG. 1B shows another example of a noise compensation system. According to this example, the noise compensation system 110 includes a television 111, a microphone 112 that is configured for sampling the acoustic environment (also referred to herein as the "audio environment") in which the noise compensation system 110 resides, and stereo loudspeakers 113 and 114. Although not shown in FIG. 1B, in this example the noise compensation system 110 includes a noise estimator and a noise compensator, which may be instances of the noise estimator 107 and the noise compensator 102 that are described above with reference to FIG. 1A. In some examples, the noise estimator and the noise compensator may be implemented via a control system, such as a control system of the television 111 (which may be an instance of the control system 210 that is described below with reference to FIG. 2), e.g., according to instructions stored on one or more non-transitory storage media.

As with other figures provided herein, the types, numbers and arrangements of elements shown in FIG. 1B are merely provided by way of example. Other implementations may include more, fewer and/or different types and numbers of elements, e.g., more loudspeakers. In some implementations, the noise compensation methods that are described with reference to FIGS. 1B-1D may be implemented via a control system of a device other than a television, such as a control system of another device having a display (e.g., a laptop computer), a control system of a smart speaker, a control system of a smart hub, a control system of another device of an audio system, etc.

According to this example, the noise compensation system 110 is shown attempting to compensate for multiple noise sources, in order to illustrate the aforementioned ambiguity of noise source to listener proximity. In this example, the audio environment 118 in which the noise compensation system 110 resides also includes a listener 116 (who is assumed to be stationary in this example), a noise source 115 that is closer to the television 111 than the listener 116 and a noise source 117 that is farther from the television 111 than the listener 116. In highly-damped rooms, a noise compensation system may overcompensate for the noise source 115 in the absence of one of the disclosed methods for solving, or compensating for, the proximity problem. In minimally-damped rooms, a noise compensation system may undercompensate for the noise source 117 in the absence of one of the disclosed methods for solving, or compensating for, the proximity problem, because the noise source 117 is closer to the listener 116 than to the microphone 112.

In this example, the noise compensation system 110 is configured for implementing a method that is based, at least in part, on a "critical distance" analysis. As used herein, a "critical distance" is a distance from an acoustic source at which the direct propagated sound pressure is equal to the diffuse field sound pressure. This property is frequency dependent and is commonly given at ISO standard octave or $\frac{1}{3}^{rd}$ octave band center frequencies. Critical distance is primarily a property of the volume (meaning the three-dimensional size, not the loudness) and the reverberance of an audio environment (e.g., of a room), but is also influenced by the directivity of the noise source. For a typical domestic living room, with an omnidirectional source, the critical distance $D_c$ is approximately 0.75 meters at 1 kHz.

In highly reverberant rooms, the noise compensation system 110 can provide adequate noise compensation, despite failing to solve the proximity problem. This is owing to the fact that in highly reverberant environments, the distribution of acoustic energy throughout the room approaches homogeneity outside the critical distance.

In other words, in highly reverberant rooms, which have small critical distances, it is likely that both the listener 116 and the television 111 will be outside the critical distance from the noise source. In that case, the reverberant sound dominates the direct sound, and the sound is relatively homogenous regardless of the source distance and the source location. Given those conditions, it is less likely that there will be a discrepancy between the noise SPL measured at the television microphone 112 and the noise SPL experienced by the listener 116. This means that error in the noise estimate due to the proximity problem becomes less likely. Because both critical distance and reverberation times are frequency-dependent properties, this probability of error is dependent on frequency as well.

Unfortunately, most residential living rooms are not highly reverberant across all frequencies. In other words, at some frequencies most residential living rooms may have larger, and sometimes much larger, critical distances than 0.75 meters. It is therefore likely that the listener 116 and the television 111 may be situated inside of the critical distance at some frequencies. At those frequencies, a noise compensation system that has not solved (or compensated for) the proximity problem will produce noise estimates that are not accurate for the noise level at a listener position, and will therefore apply an incorrect noise compensation.

Therefore, some disclosed implementations involve predicting the probability of error due to the proximity problem. To solve this problem, existing functionality within some previously-deployed devices may be leveraged to identify features of the acoustic environment. At least some previously-deployed devices that implement noise compensation will also feature a room acoustics compensation system. Using information already available from an existing room acoustics compensation system, frequency-dependent reverberation times (also known as spectral decay times) can be computed. This is accomplished by taking the impulse response of the system (already calculated for the room acoustics compensation system), and splitting it into discrete frequency bands. The time from the peak of the impulse to the point at which it has reduced in magnitude by 60 dB is the reverberation time for that frequency band.

After the spectral decay times are determined, the spectral decay times can be used, along with some knowledge of the room volume and source directivity, to infer the critical distance, from which the control system may predict the probability of a noise estimate error due to the proximity problem. If a small critical distance is predicted for a particular frequency bin (which may also be referred to herein as a frequency range or frequency band), in some implementations this will result in a high confidence score (e.g., 1.0) for the ambient noise estimate in that frequency bin. According to some examples, the noise compensation system may then perform unconstrained noise compensation in that frequency bin. The unconstrained noise compensation may, in some examples, correspond with a "default" noise compensation that would have been performed in response to the ambient noise estimate in that frequency bin according to a noise compensation method, e.g., ensuring the level of played-back audio exceeds the level of ambient noise detected by the microphone 112 by at least a threshold amount. The unconstrained noise compensation may, in some examples, correspond with a noise compensation method in which the output signal level of at least some frequency bands is not constrained according to the output signal level of and/or imposed thresholds for, other frequency bands.

In frequency bins for which the predicted critical distance is larger, in some implementations this will result in a lower confidence score for these frequency bins. In some examples, a lower confidence score results in implementing a modified noise compensation method. According to some such examples, the modified noise compensation method corresponding with a low confidence score may be a more conservative noise compensation method in which the level of played-back audio is boosted less than the level would be boosted according to the default method, to reduce the likelihood of erroneously large corrections.

According to some examples, a minimum (e.g., zero) confidence score may correspond with a minimum applied gain (e.g., a minimum difference between a reproduced audio level and an estimated ambient noise level) and a maximum (e.g., 1.0) confidence score may correspond with an unconstrained or "default" level adjustment for noise compensation. In some examples, confidence values between the minimum and the maximum may correspond to linear interpolations between a level adjustment corresponding to the minimum confidence score (e.g., the minimum applied gain) and the "default" level adjustment for noise compensation.

In some implementations, a minimum (e.g., zero) confidence score may correspond with a timbre-preserving noise compensation method and a maximum (e.g., 1.0) confidence score may correspond with an unconstrained or "default" level adjustment for noise compensation. The term "timbre-preserving" may have a variety of meanings as used herein. Broadly speaking, a "timbre-preserving" method is one that at least partially preserves the frequency content, or timbre of an input audio signal. Some timbre-preserving methods may completely, or almost completely, preserve the frequency content of an input audio signal. A timbre-preserving method may involve constraining the output signal level of at least some frequency bands according to the output signal level and/or imposed thresholds of at least some other frequency bands. In some examples, a "timbre-preserving" method may involve constraining, at least to some degree, the output signal level of all non-isolated frequency bands. (In some examples, if a frequency band is "isolated," then only the audio in that frequency band has an effect on the limiting gain that is applied.)

In some examples, confidence values may be inversely proportional to a timbre preservation setting. For example, if the minimum confidence value is 0.0 and the maximum confidence value is 1.0, a minimum (e.g., zero) confidence score may correspond with timbre preservation setting of 100% or 1.0. In some examples, a timbre preservation setting of 0.50 may correspond with a confidence value of 0.5. In some such examples, a confidence value of 0.25 may correspond to a timbre preservation setting of 0.75.

For the proximity problem to be considered unimportant in any given frequency bin, the listener must be outside the critical distance for that frequency bin. The critical distance for a particular frequency may inferred from the reverberation time for that frequency using a statistical reverberation time model, e.g., as follows:

$$D_c = 0.057\sqrt{\frac{QV}{T}} \qquad \text{Equation 1}$$

In Equation 1, $D_c$ represents the critical distance, Q represents the directivity factor of the noise source (assumed to omni-directional in some implementations), V represents the volume of the room (e.g., in m$^3$) and T represents the measured reverberation time, $RT_{60}$, in seconds. $RT_{60}$ is defined as the time required for the amplitude of a theoretically perfect impulse to decay in amplitude by 60 dB.

In some examples, the volume of the room may be assumed to be a particular size, e.g., 60 m$^3$, based on typical living room sizes. In some examples, the volume of the room may be determined according to input from a user, e.g., via a graphical user interface (GUI) at the time of unboxing/setup. The input may be numerical, e.g., based on a user's actual measurements or estimates. In some such implementations, a user may be presented with a set of "multiple choice" options (e.g., is your room a large room, a medium-sized room or a small room") via the GUI. Each option may correspond with a different value of V.

In some implementations, the Equation 1 is solved for each of a plurality of frequency bins, e.g., for every frequency bin used by the noise compensation system 110. According to some examples, a confidence score may be produced by the following method:

It is assumed that the listener 116 will not be seated less than 2 meters from the television 111.
If the predicted critical distance is equal to, or smaller than 2 meters, the confidence score is set to 1.

With increasing critical distance, the confidence score decreases, up to a lower bound, where $D_c=5$ m and confidence=0.

Alternative examples may involve alternative methods of determining a confidence score. The alternative methods may, for example, involve a different assumption about the proximity of the listener 116 to the television 111 and/or a different critical distance for the lower bound, e.g., of 4 meters, 4.5 meters, 5.5 meters, 6 meters, etc. Some implementations may involve measuring or estimating the actual position of the listener 116 and/or the distance between the listener 116 and the television 111. Some implementations may involve obtaining user input regarding the actual position of the listener 116 and/or the distance between the listener 116 and the television 111. Some examples may involve determining a location of a device, such as a cellular telephone or a remote control device, and assuming that the location of the device corresponds with the location of the listener.

According to various disclosed implementations, the above-described confidence scores represent the probability of errors in the noise estimation of the noise compensation system 110. Given that there may, in some implementations, be no way to differentiate between an overestimate and an underestimate, in some such implementations the noise compensation system 110 may always assume the noise estimation error to be an overestimate. This assumption reduces the likelihood that the noise compensation system 110 will erroneously apply excessive gains to the audio reproduced by the loudspeakers 113 and 114. Such implementations are potentially advantageous, because applying excessive gains would generally be a more perceptually obvious failure mode than the opposite case of applying insufficient gains to adequately overcome the ambient noise.

In some implementations, if the confidence score is 1, the frequency-dependent gains calculated by the noise compensation system 110 are applied unconstrained. According to some such implementations, for all confidence values less than 1, these frequency-dependent gains are scaled down.

Figure 1C:
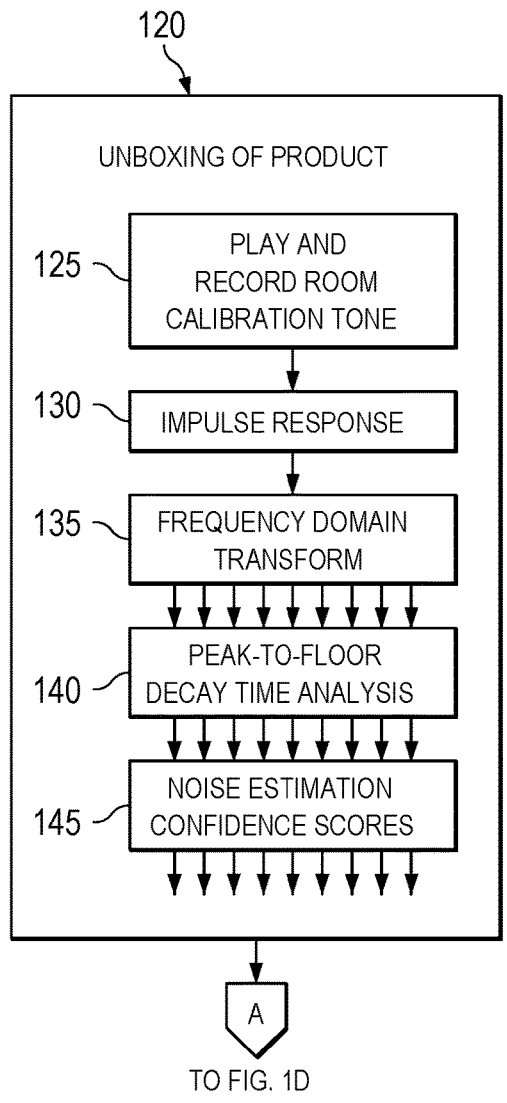
FIG. 1C is a flow diagram that illustrates a method of using a spectral decay time measurement to score the confidence of noise estimates according to some disclosed examples.

FIG. 1C is a flow diagram that illustrates a method of using a spectral decay time measurement to score the confidence of noise estimates according to some disclosed examples. This figure shows the use of an impulse response, which in some implementations may have already been derived for the purpose of room acoustics compensation. According to this example, this impulse response is decomposed into discrete frequency bands corresponding to the bands that the noise compensation system operates in. The time taken for each of these band-limited impulse responses to decay by 60 dB is the reverberation time RT60 for that band.

Figure 1D:
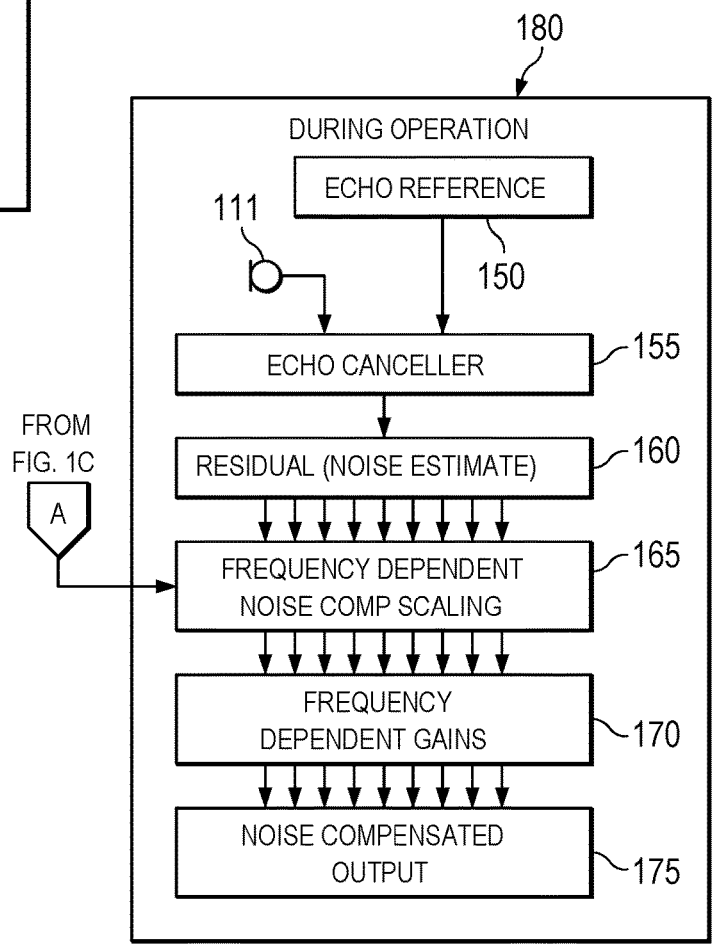
FIG. 1D is a flow diagram that illustrates a method of using noise estimate confidence scores in a noise compensation process according to some disclosed examples.

FIG. 1D is a flow diagram that illustrates a method of using the noise estimate confidence scores in a noise compensation process according to some disclosed examples. The operations shown in FIGS. 1C and 1D may, for example, be performed via a control system such as the control system 210 that is described below with reference to FIG. 2. The blocks of methods 120 and 180, like other methods described herein, are not necessarily performed in the order indicated. Moreover, such methods may include more or fewer blocks than shown and/or described. In the examples shown in FIGS. 1C and 1D, blocks including multiple arrows indicate that the corresponding audio signal is separated into frequency bins by a filter bank.

The method 120 of FIG. 1C may correspond to a "set-up" mode that may, for example, occur when a television, an audio device, etc., is first installed in an audio environment.

In this example, block 125 involves causing one or more audio reproduction transducers to play a room calibration signal. Here, block 130 involves recording the impulse response of the room to the room calibration signal via one or more microphones.

Here, block 135 involves transforming the impulse response from the time domain into the frequency domain: here, the corresponding audio signal is separated into frequency bins by a filter bank. In this example, block 140 involves performing a decay time analysis and determining the reverberation time, $RT_{60}$, in seconds. This analysis involves finding the peak of each band-limited impulse response, counting the number of samples until the impulse response decays in magnitude by 60 dB, then dividing that number of samples by the sampling frequency in Hz. The result is the reverberation time RT60, in seconds, for that band.

According to this example, block 145 involves determining noise estimation confidence scores for each of a plurality of frequency bins, e.g., for every frequency bin used by the noise compensation system 110. In some implementations, block 145 involves solving Equation 1 for each of the frequency bins. Although not shown in FIG. 1C, a value of V, corresponding to the volume of the room, is also determined in method 120, e.g., according to user input, based on a room measurement or estimation process according to sensor input or by using a default value. According to some examples, a confidence score may be produced by assuming that the listener 116 will not be seated less than 2 meters from the television 111, setting the confidence score is set to 1 if the predicted critical distance is equal to, or smaller than 2 meters. With increasing critical distance, the confidence score may decrease, e.g., up to a lower bound where the critical distance is 5 m and the confidence score is zero. Alternative examples may involve alternative methods of determining a confidence score. In some instances, the confidence scores determined in block 145 may be stored in a memory.

In this example, the method 180 of FIG. 1D corresponds to a "run time" mode that may, for example, occur when a television, an audio device, etc., is in use on a day to day basis, after the method of FIG. 1C has been performed. In this example, echo cancellation block 155 involves receiving microphone signals from the microphone 111 and also receiving an echo reference signal 150, which may be a speaker feed signal provided to an audio reproduction transducer of the audio environment. Here, block 160 involves producing a noise estimate for each of a plurality of frequency bins (also referred to herein as frequency bands), based on output from the echo cancellation block 155.

In this example, noise compensation scaling block 165 involves applying the confidence scores that were determined in block 145 in order to provide appropriate scaling, if any, for noise compensation gains that will be applied based on the frequency-dependent noise estimate received from block 160. In some instances, the confidence scores that were determined in block 145 may have been stored for later use, e.g., in the run time operations of method 180. The scaling determined by the noise compensation scaling block 165 may, for example, be performed according to one of the examples described above with reference to FIG. 1B.

According to this example, block 170 involves determining frequency-dependent gains based on the scaling values received from the noise compensation scaling block 165. Here, block 175 involves providing noise-compensated output audio data to one or more audio transducers of the audio environment.

Figure 2:
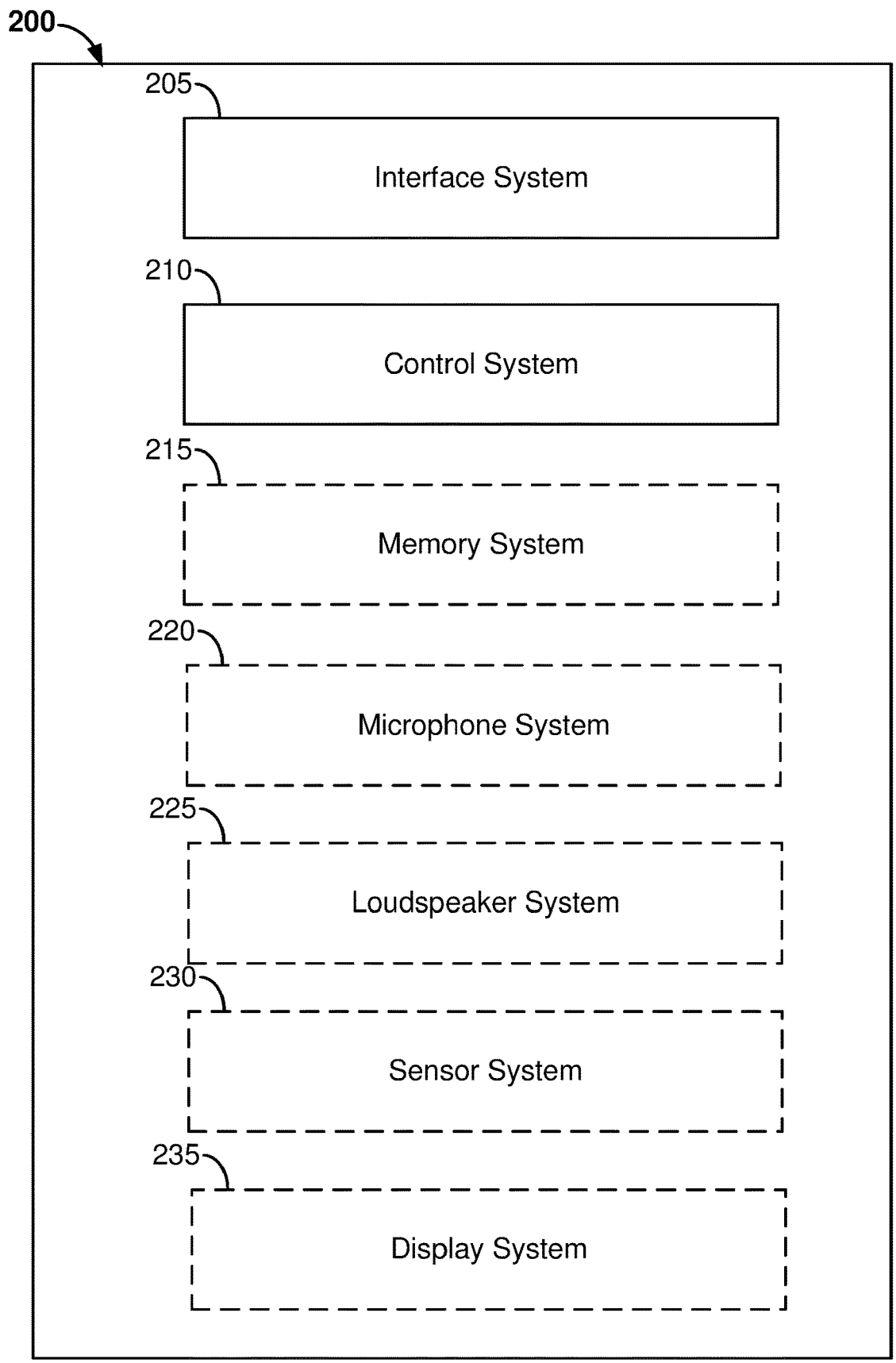
FIG. 2 is a block diagram that shows examples of components of an apparatus capable of implementing various aspects of this disclosure.

FIG. 2 is a block diagram that shows examples of components of an apparatus capable of implementing various aspects of this disclosure. As with other figures provided herein, the types, numbers and arrangements of elements shown in FIG. 2 are merely provided by way of example. Other implementations may include more, fewer and/or different types and numbers of elements. According to some examples, the apparatus 200 may be configured for performing at least some of the methods disclosed herein. In some implementations, the apparatus 200 may be, or may include, a television, one or more components of an audio system, a mobile device (such as a cellular telephone), a laptop computer, a tablet device, a smart speaker, or another type of device. In some implementations, the apparatus 200 may be, or may include, a television control module. The television control module may or may not be integrated into a television, depending on the particular implementation. In some implementations, the television control module may be a separate device from a television and may, in some instances, either be sold separately from a television or as an add-on or optional device that may be included with a purchased television. In some implementations, the television control module may be obtainable from a content provider, such as a provider of television programs, movies, etc.

According to some alternative implementations the apparatus 200 may be, or may include, a server. In some such examples, the apparatus 200 may be, or may include, an encoder. Accordingly, in some instances the apparatus 200 may be a device that is configured for use within an audio environment, such as a home audio environment, whereas in other instances the apparatus 200 may be a device that is configured for use in "the cloud," e.g., a server.

In this example, the apparatus 200 includes an interface system 205 and a control system 210. The interface system 205 may, in some implementations, be configured for communication with one or more other devices of an audio environment. The audio environment may, in some examples, be a home audio environment. In other examples, the audio environment may be another type of environment, such as an office environment, an automobile environment, a train environment, a street or sidewalk environment, a park environment, etc. According to some implementations, the size and/or reverberation of the audio environment may be assumed, based on the audio environment type. For example, a default office size may be used for an office audio environment. The audio environment type may, for example, be determined according to user input or based on audio characteristics of the environment. The interface system 205 may, in some implementations, be configured for exchanging control information and associated data with audio devices of the audio environment. The control information and associated data may, in some examples, pertain to one or more software applications that the apparatus 200 is executing.

The interface system 205 may, in some implementations, be configured for receiving, or for providing, a content stream. The content stream may include audio data. The audio data may include, but may not be limited to, audio signals. In some instances, the audio data may include spatial data, such as channel data and/or spatial metadata. According to some implementations, the content stream may include metadata regarding a dynamic range of the audio data and/or metadata regarding one or more noise compensation methods. Metadata regarding a dynamic range of the audio data and/or metadata regarding one or more noise compensation methods may, for example, have been provided by one or more devices configured to implement a cloud-based service, such as one or more servers. Metadata regarding a dynamic range of the audio data and/or metadata regarding one or more noise compensation methods may, for example, have been provided by what may be referred to herein as an "encoder." In some such examples, the content stream may include video data and audio data corresponding to the video data. Some examples of encoder and decoder operations are described below.

The interface system 205 may include one or more network interfaces and/or one or more external device interfaces (such as one or more universal serial bus (USB) interfaces). According to some implementations, the interface system 205 may include one or more wireless interfaces. The interface system 205 may include one or more devices for implementing a user interface, such as one or more microphones, one or more speakers, a display system, a touch sensor system and/or a gesture sensor system. In some examples, the interface system 205 may include one or more interfaces between the control system 210 and a memory system, such as the optional memory system 215 shown in FIG. 2. However, the control system 210 may include a memory system in some instances. The interface system 205 may, in some implementations, be configured for receiving input from one or more microphones in an environment.

The control system 210 may, for example, include a general purpose single- or multi-chip processor, a digital signal processor (DSP), an application specific integrated circuit (ASIC), a field programmable gate array (FPGA) or other programmable logic device, discrete gate or transistor logic, and/or discrete hardware components.

In some implementations, the control system 210 may reside in more than one device. For example, in some implementations a portion of the control system 210 may reside in a device within one of the environments depicted herein and another portion of the control system 210 may reside in a device that is outside the environment, such as a server, a mobile device (e.g., a smartphone or a tablet computer), etc. In other examples, a portion of the control system 210 may reside in a device within one of the environments depicted herein and another portion of the control system 210 may reside in one or more other devices of the environment. For example, control system functionality may be distributed across multiple smart audio devices of an environment, or may be shared by an orchestrating device (such as what may be referred to herein as a smart home hub) and one or more other devices of the environment. In other examples, a portion of the control system 210 may reside in a device that is implementing a cloud-based service, such as a server, and another portion of the control system 210 may reside in another device that is implementing the cloud-based service, such as another server, a memory device, etc. The interface system 205 also may, in some examples, reside in more than one device.

In some implementations, the control system 210 may be configured for performing, at least in part, the methods disclosed herein. According to some examples, the control system 210 may be configured for implementing methods of content stream processing.

Some or all of the methods described herein may be performed by one or more devices according to instructions (e.g., software) stored on one or more non-transitory media. Such non-transitory media may include memory devices such as those described herein, including but not limited to random access memory (RAM) devices, read-only memory (ROM) devices, etc. The one or more non-transitory media may, for example, reside in the optional memory system 215 shown in FIG. 2 and/or in the control system 210. Accordingly, various innovative aspects of the subject matter described in this disclosure can be implemented in one or more non-transitory media having software stored thereon. The software may, for example, include instructions for controlling at least one device to process a content stream, to encode a content stream, to decode a content stream, etc. The software may, for example, be executable by one or more components of a control system such as the control system 210 of FIG. 2.

In some examples, the apparatus 200 may include the optional microphone system 220 shown in FIG. 2. The optional microphone system 220 may include one or more microphones. In some implementations, one or more of the microphones may be part of, or associated with, another device, such as a speaker of the speaker system, a smart audio device, etc. In some examples, the apparatus 200 may not include a microphone system 220. However, in some such implementations the apparatus 200 may nonetheless be configured to receive microphone data for one or more microphones in an audio environment via the interface system 210. In some such implementations, a cloud-based implementation of the apparatus 200 may be configured to receive microphone data, or a noise metric corresponding at least in part to the microphone data, from one or more microphones in an audio environment via the interface system 210.

According to some implementations, the apparatus 200 may include the optional loudspeaker system 225 shown in FIG. 2. The optional loudspeaker system 225 may include one or more loudspeakers, which also may be referred to herein as "speakers" or, more generally, as "audio reproduction transducers." In some examples (e.g., cloud-based implementations), the apparatus 200 may not include a loudspeaker system 225.

In some implementations, the apparatus 200 may include the optional sensor system 230 shown in FIG. 2. The optional sensor system 230 may include one or more touch sensors, gesture sensors, motion detectors, etc. According to some implementations, the optional sensor system 230 may include one or more cameras. In some implementations, the cameras may be free-standing cameras. In some examples, one or more cameras of the optional sensor system 230 may reside in a smart audio device, which may be a single purpose audio device or a virtual assistant. In some such examples, one or more cameras of the optional sensor system 230 may reside in a television, a mobile phone or a smart speaker. In some examples, the apparatus 200 may not include a sensor system 230. However, in some such implementations the apparatus 200 may nonetheless be configured to receive sensor data for one or more sensors in an audio environment via the interface system 210.

In some implementations, the apparatus 200 may include the optional display system 235 shown in FIG. 2. The optional display system 235 may include one or more displays, such as one or more light-emitting diode (LED) displays. In some instances, the optional display system 235 may include one or more organic light-emitting diode (OLED) displays. In some examples, the optional display system 235 may include one or more displays of a television. In other examples, the optional display system 235 may include a laptop display, a mobile device display, or another type of display. In some examples wherein the apparatus 200 includes the display system 235, the sensor system 230 may include a touch sensor system and/or a gesture sensor system proximate one or more displays of the display system 235. According to some such implementations, the control system 210 may be configured for controlling the display system 235 to present one or more graphical user interfaces (GUIs).

According to some such examples the apparatus 200 may be, or may include, a smart audio device. In some such implementations the apparatus 200 may be, or may include, a wakeword detector. For example, the apparatus 200 may be, or may include, a virtual assistant.

Figure 3:
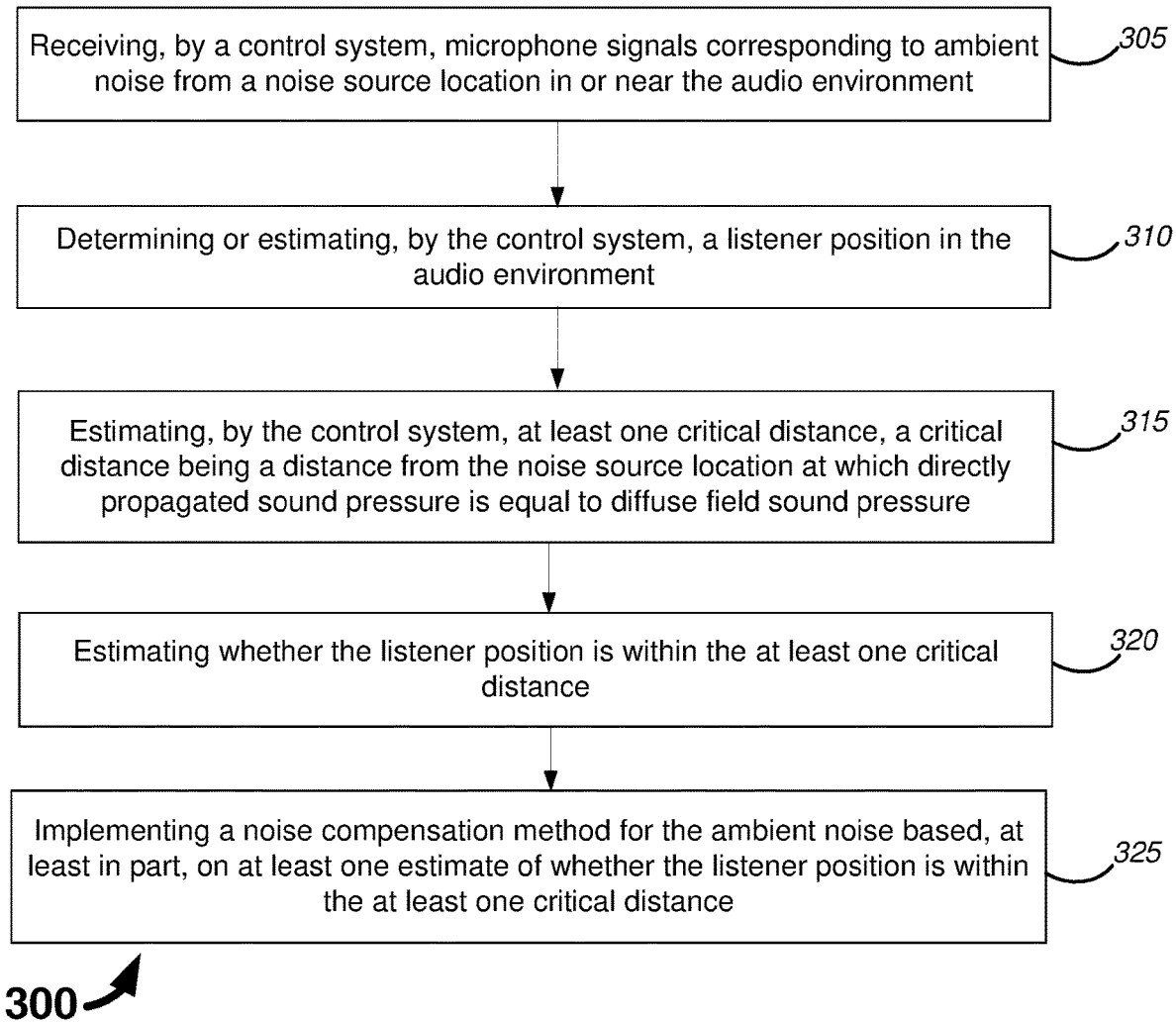
FIG. 3 is a flow diagram that outlines one example of a disclosed method.

FIG. 3 is a flow diagram that outlines one example of a disclosed method. The blocks of method 300, like other methods described herein, are not necessarily performed in the order indicated. Moreover, such methods may include more or fewer blocks than shown and/or described. The method 300 may be performed by an apparatus or system, such as the apparatus 200 that is shown in FIG. 2 and described above. In some examples, the blocks of method 300 may be performed by one or more devices within an audio environment, e.g., an audio system controller or another component of an audio system, such as a smart speaker, a television, a television control module, a smart speaker, a mobile device, etc. In some implementations, the audio environment may include one or more rooms of a home environment. In other examples, the audio environment may be another type of environment, such as an office environment, an automobile environment, a train environment, a street or sidewalk environment, a park environment, etc. However, in alternative implementations at least some blocks of the method 300 may be performed by a device that implements a cloud-based service, such as a server.

In this implementation, block 305 involves receiving, by a control system and via an interface system, microphone signals corresponding to ambient noise from a noise source location in or near an audio environment. In some implementations, the control system and the interface system may be the control system 210 and the interface system 205 shown in FIG. 2 and described above.

In this example, block 310 involves determining or estimating, by the control system, a listener position in the audio environment. According to some examples, block 310 may involve determining a listener position according to a default value of an assumed listener position, e.g., that the listener is 2 meters in front of a television or other device or at least 2 meters in front of the television or other device, that the listener is seated on a piece of furniture having a known location with reference to a television or other device, etc. However, in some implementations block 310 may involve determining a listener position according to user input, determining a listener position according to sensor input (e.g., from a camera of the sensor system 230 shown in FIG. 2), etc. Some examples may involve determining a location of a device, such as a cellular telephone or a remote control device, and assuming that the location of the device corresponds with the listener position.

According to this example, block 315 involves estimating, by the control system, at least one critical distance. As noted elsewhere herein, a critical distance is a distance from the noise source location at which directly propagated sound pressure is equal to diffuse field sound pressure. In some examples, block 315 may involve retrieving at least one estimated critical distance from a memory in which the results of the method of FIG. 1C, or a similar method, have been stored. Some such methods may involve controlling, via the control system, an audio reproduction transducer system in an audio environment to reproduce one or more room calibration sounds. The audio reproduction transducer system including one or more audio reproduction transducers. Some such methods may involve receiving, by the control system and via the interface system, microphone signals corresponding to the audio environment's response to the one or more room calibration sounds. Some such methods may involve determining, by the control system and based on the microphone signals, a reverberation time for each of a plurality of frequencies. Some such methods may involve determining or estimating an audio environment volume of the audio environment (in other words, determining the size of the audio environment in cubic feet, cubic meters, etc.), e.g., as disclosed elsewhere herein. According to some such examples, estimating the at least one critical distance may involve calculating, based at least in part on the plurality of frequency-dependent reverberation times and the audio environment volume, a plurality of estimated frequency-based critical distances. Each estimated frequency-based critical distance of the plurality of estimated frequency-based critical distances may correspond to a frequency of the plurality of frequencies.

In this example, block 320 involves estimating whether the listener position is within the at least one critical distance. According to some examples, block 320 may involve estimating whether the listener position is within each frequency-based critical distance of the plurality of frequency-based critical distances. In some examples, method 300 may involve transforming the microphone signals corresponding to the ambient noise from a time domain into a frequency domain and determining a frequency band ambient noise level estimate for each of a plurality of ambient noise frequency bands. According to some such examples, method 300 may involve determining a frequency-based confidence level for each of the frequency band ambient noise level estimates. Each frequency-based confidence level may, for example, correspond to an estimate or a probability of whether the listener position is within each frequency-based critical distance. In some examples, each frequency-based confidence level may be inversely proportional to each frequency-based critical distance.

According to this implementation, block 325 involves implementing a noise compensation method for the ambient noise based, at least in part, on at least one estimate of whether the listener position is within the at least one critical distance. In some examples, block 325 may involve implementing a frequency-based noise compensation method based on the frequency-based confidence level for each ambient noise frequency band. According to some such examples, the frequency-based noise compensation method may involve applying a default noise compensation method for each ambient noise frequency band for which the confidence level is at or above a threshold confidence level. In some instances, the threshold confidence level may be the maximum confidence level, e.g., 1.0. However, in other examples in which the maximum confidence level is 1.0, the threshold confidence level may be another confidence level, e.g., 0.80, 0.85, 0.90, 0.95, etc.

In some examples, the frequency-based noise compensation method may involve modifying a default noise compensation method for each ambient noise frequency band for which the confidence level is below a threshold confidence level. According to some such examples, modifying the default noise compensation method may involve reducing a default noise compensation level adjustment for one or more frequency bands.

In some examples, confidence values between the minimum and the threshold confidence level (e.g., the maximum confidence level) may correspond to a linear interpolations between the minimum applied gain and the "default" level adjustment for noise compensation. In some implementations, a minimum (e.g., zero) confidence score may correspond with a timbre-preserving noise compensation method and a maximum (e.g., 1.0) confidence score may correspond with an unconstrained or "default" level adjustment for noise compensation. In some examples, confidence values may be inversely proportional to a timbre preservation setting. For example, if the minimum confidence value is 0.0 and the maximum confidence value is 1.0, a minimum (e.g., zero) confidence score may correspond with timbre preservation setting of 100% or 1.0. In some examples, a timbre preservation setting of 0.50 may correspond with a confidence value of 0.5. In some such examples, a confidence value of 0.25 may correspond to a timbre preservation setting of 0.75.

According to some examples, method 300 may involve receiving, by the control system and via the interface system, a content stream that includes audio data. In some such examples, implementing the noise compensation method in block 325 may involve applying the noise compensation method to the audio data to produce noise-compensated audio data. Some such implementations may involve providing, by the control system and via the interface system, the noise-compensated audio data to one or more audio reproduction transducers of the audio environment. Some such implementations may involve rendering, by the control system, the noise-compensated audio data to produce rendered audio signals. Some such implementations may involve providing, by the control system and via the interface system, the rendered audio signals to at least some audio reproduction transducers of a set of audio reproduction transducers of the audio environment.

Figure 4B:
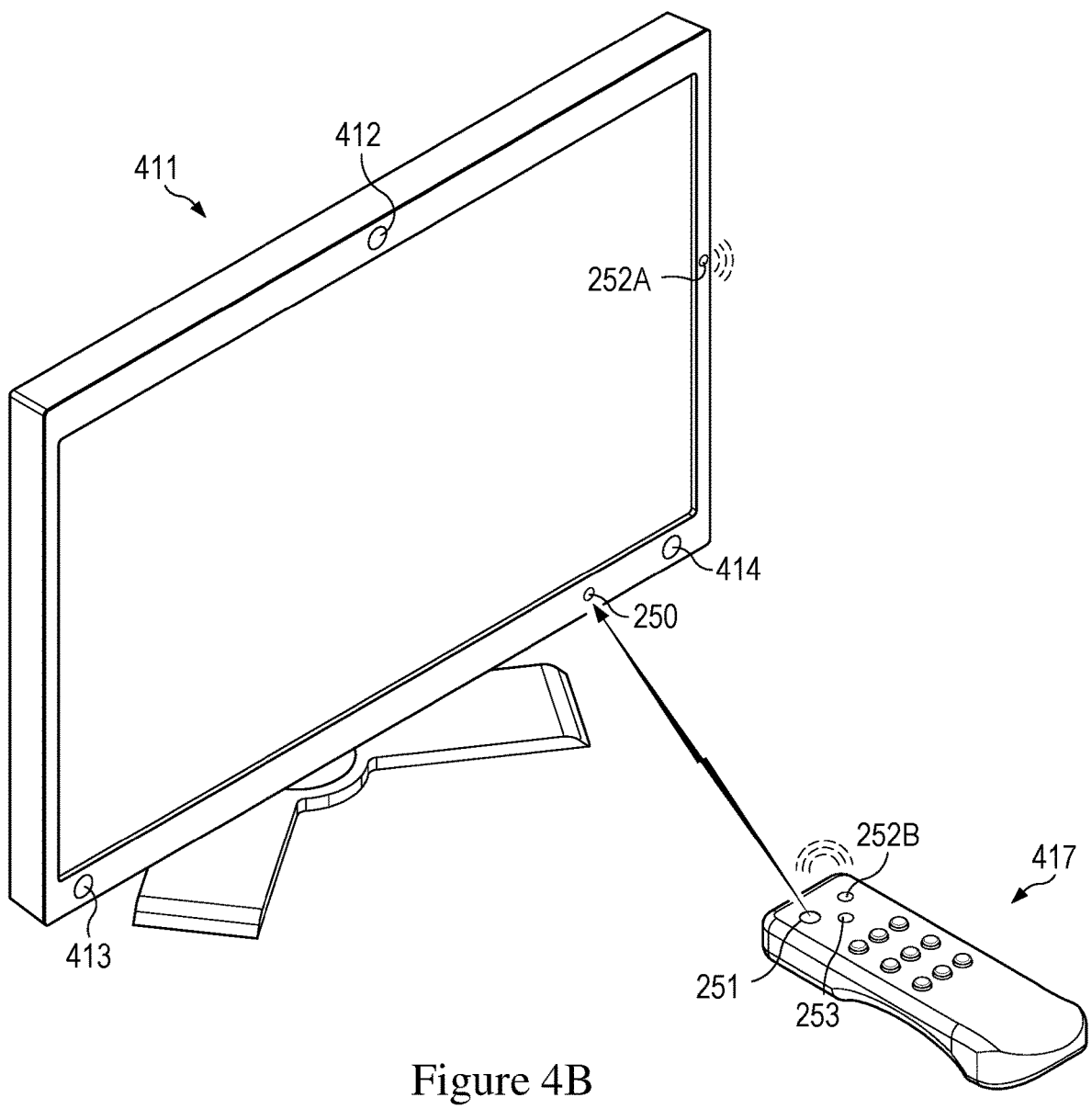
Figure 4C:
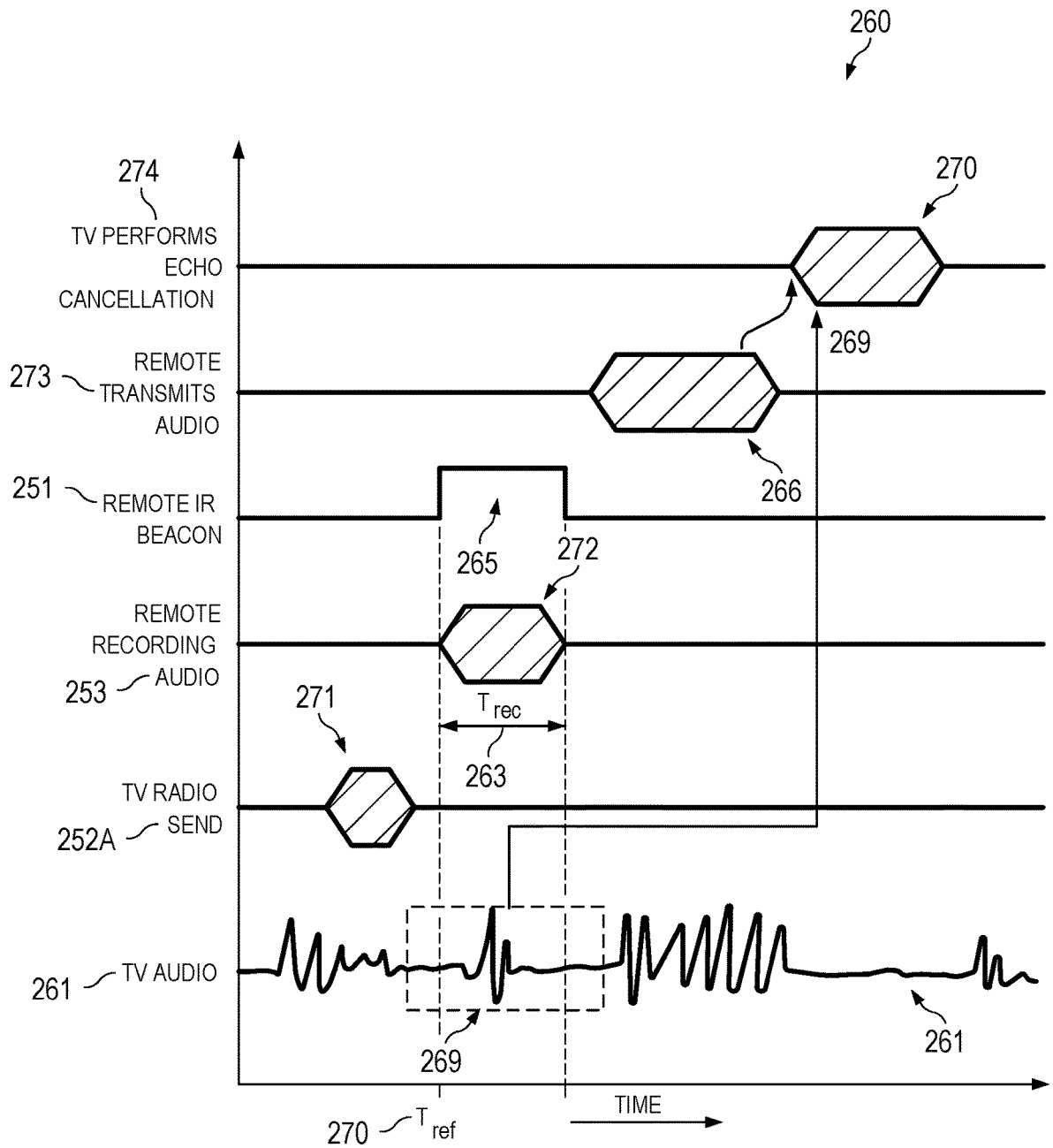
FIG. 4C is a timing diagram that shows examples of operations that may be performed via the noise compensation system shown in FIGS. 4A and 4B.

FIGS. 4A and 4B shows additional examples of noise compensation system components. FIG. 4C is a timing diagram that shows examples of operations that may be performed via the noise compensation system shown in FIGS. 4A and 4B. According to these examples, the noise compensation system 410 includes a television 411, a television microphone 412 that is configured for sampling the audio environment in which the noise compensation system 410 resides, stereo loudspeakers 413 and 414, and a remote control 417 for the television 411. Although not shown in FIGS. 4A and 4B, in this example, the noise compensation system 410 includes a noise estimator and a noise compensator, which may be instances of the noise estimator 107 and the noise compensator 102 that are described above with reference to FIG. 1A.

In some examples, the noise estimator 107 and the noise compensator 102 may be implemented via a control system, such as a control system of the television 411 (which may be an instance of the control system 210 that is described below with reference to FIG. 2), e.g., according to instructions stored on one or more non-transitory storage media. Similarly, the operations described with reference to FIGS. 4A-5 may be via a control system of the television 411, via a control system of the remote control 417, or via both control systems, depending on the particular implementation. In some implementations, the noise compensation methods that are described with reference to FIGS. 4A-5 may be implemented via a control system of a device other than a television and/or a remote control device, such as a control system of another device having a display (e.g., a laptop computer), a control system of a smart speaker, a control system of a smart hub, a control system of another device of an audio system, etc. In some implementations, a smart phone (a cellular telephone) or a smart speaker (e.g., a smart speaker configured to provide virtual assistant functionality)

may be configured to perform the operations that are described with reference to FIGS. 4A-4C as being performed by the remote control 417. As with other figures provided herein, the types, numbers and arrangements of elements shown in FIGS. 4A-4C are merely provided by way of example. Other implementations may include more, fewer and/or different types, numbers or arrangements of elements, e.g., more loudspeakers and/or more microphones, more or fewer operations, etc. For example, in other implementations the arrangement of elements on the remote control 417 (e.g., of the remote control microphone 253, the radio transceiver 252B and/or the infrared (IR) transmitter 251) may be different. In some such examples, the radio transceiver 252B and/or the infrared (IR) transmitter 251 may reside on the front side of the remote control 417, e.g., the side that is shown pointing towards the television 411 in FIG. 4B.

In the example shown in FIG. 4A, the audio environment 400 in which the noise compensation system 410 resides also includes a listener 416 (who is assumed to be stationary in this example) and a noise source 415 that is closer to the television 411 than the listener 416. The type and location of the noise source 415 are merely shown by way of example. In alternative examples the listener 416 may not be stationary. In some such examples, the listener 416 will be assumed to be in the same location as the remote control 417 or another device capable of providing similar functionality, such as a cellular telephone.

In the examples shown in FIGS. 4A and 4B, the remote control 417 is battery powered and incorporates a remote control microphone 253. In some implementations, the remote control 417 includes the remote control microphone 253 because the remote control 417 is configured to provide voice assistant functionality. In order to conserve battery life, in some implementations the remote control microphone 253 is not sampling the ambient noise at all times, nor is the remote control microphone 253 transmitting a continuous stream to the television 411. Rather, in some such examples, the remote control microphone 253 is not always on, but instead "listens" when the remote control 417 receives corresponding input, such as a button being pushed.

In some examples, the remote control microphone 253 can be used to provide noise level measurements when polled by the television 411, in order to resolve the proximity problem. In some such implementations the remote control microphone 253 may be awakened in response to a signal from the television 411 to the remote control 417, e.g., from the radio transceiver 252A to the radio transceiver 252B shown in FIG. 4B. The signal from the television 411 may be in response to ambient noise detected by the television microphone 412. Alternatively, or additionally, in some examples the remote control 417 may be polled by the television 411 at regular intervals for short, time-windowed ambient noise recordings. According to some examples, when the ambient noise abates, the television 411 may cause the polling to be discontinued. In some alternative examples, the television 411 may be configured to cause the polling to be discontinued when the television 411 has an adequate conversion function between the noise level at the location of the remote control 417 and the television microphone 412. According to some such implementations, the television 411 may be configured to resume polling to upon receiving an indication that the remote control 417 has moved, e.g., upon receiving inertial sensor signals from the remote control 417 corresponding to movement. In some implementations, the levels of recordings made via the remote control microphone 253 may be used to determine whether the noise estimates made at the television 411 are valid for the listener position (which in some examples is presumed to correspond with the position of the remote control 417), thereby ensuring that background noise is not over compensated or undercompensated due to proximity error.

According to some examples, upon a polling request from the television 411, the remote control 417 may send a short recording of audio detected by the remote control microphone 253 to the television 411 across a wireless connection, e.g., from the radio transceiver 252B to the radio transceiver 252A shown in FIG. 4B. The control system of the television 411 may be configured to remove the output of the loudspeakers 413 and 414 from the recording, e.g., by passing the recording through an echo canceller. In some examples, the control system of the television 411 may be configured to compare the residual noise recording with the ambient noise detected by the television microphone 412 in order to determine whether the ambient noise from the noise source is louder at the television microphone 412 or the listener position. In some implementations, a noise estimate made according to input from the television microphone 412 may be scaled accordingly, e.g., according to the ratio of the ambient noise level detected by the remote control microphone 253 to the ambient noise level detected by the television microphone 412.

According to some implementations, signals sent by the infrared (IR) transmitter 251 of the remote control 417 and received by IR receiver 250 of the television 411 may be used as a synchronization reference, e.g., to time-align the echo reference with the remote control's recordings for the purpose of echo cancellation. Such implementations can solve the problem of clock synchronization between the remote control 417 and the television 411 without the need for clock signals to be transmitted continuously, which would have an unacceptable impact on battery life.

FIG. 4C shows a detailed example of one such implementation. In this example, time is depicted as the horizontal axis and a variety of different operations are illustrated perpendicular to various portions of the vertical axis. In this example, the audio that is played back by television loudspeakers 413 and 414 of FIGS. 4A and 4B is represented as the waveform 261.

According to this example, the television 411 sends a radio signal 271 to the remote control 417, via the radio transceiver 252A. The radio signal 271 may, for example, be sent in response to ambient noise detected by the television microphone 412. In this example, the radio signal 271 includes instructions for the remote control 417 to record an audio segment via the remote control microphone 253. In some examples, the radio signal 271 may include a start time (e.g., the time $T_{ref}$ shown in FIG. 4C), information for determining the start time, a time interval, etc., for the remote control 417 to record the audio segment.

In this example, the remote control 417 records signals received by the remote control microphone 253 as the audio segment 272 during a recorded audio segment time interval $T_{rec}$. According to this example, the remote control 417 sends a signal 265 to the television 411 indicating the recorded audio segment time interval $T_{rec}$. Here, the signal 265 indicates that the recorded audio segment time interval Tree begins at time $T_{ref}$ and ends at a time 263, when the signal 265 ceases to be transmitted. In this example, the remote control 417 sends the signal 265 via the IR transmitter 251. Accordingly, the television 411 can identify the time interval for a content stream audio segment 269 that is being reproduced by the television loudspeakers 413 and 414 during the recorded audio segment time interval $T_{rec}$.

In this example, the remote control 417 subsequently sends a signal 266 to the television 411 that includes the recorded audio segment. According to this implementation, a control system of the television 411 performs an echo cancellation process based on the recorded audio segment and the content stream audio segment 269, in order to obtain an ambient noise signal 270 at the location of the remote control 417, which in this example is presumed to correspond with a location of the listener 416. In some such implementations, a control system of the television 411 is configured for implementing a noise compensation method for the audio data that is to be reproduced by the television loudspeakers 413 and 414 based, at least in part, on the ambient noise signal 270, to produce noise-compensated audio data.

Figure 5:
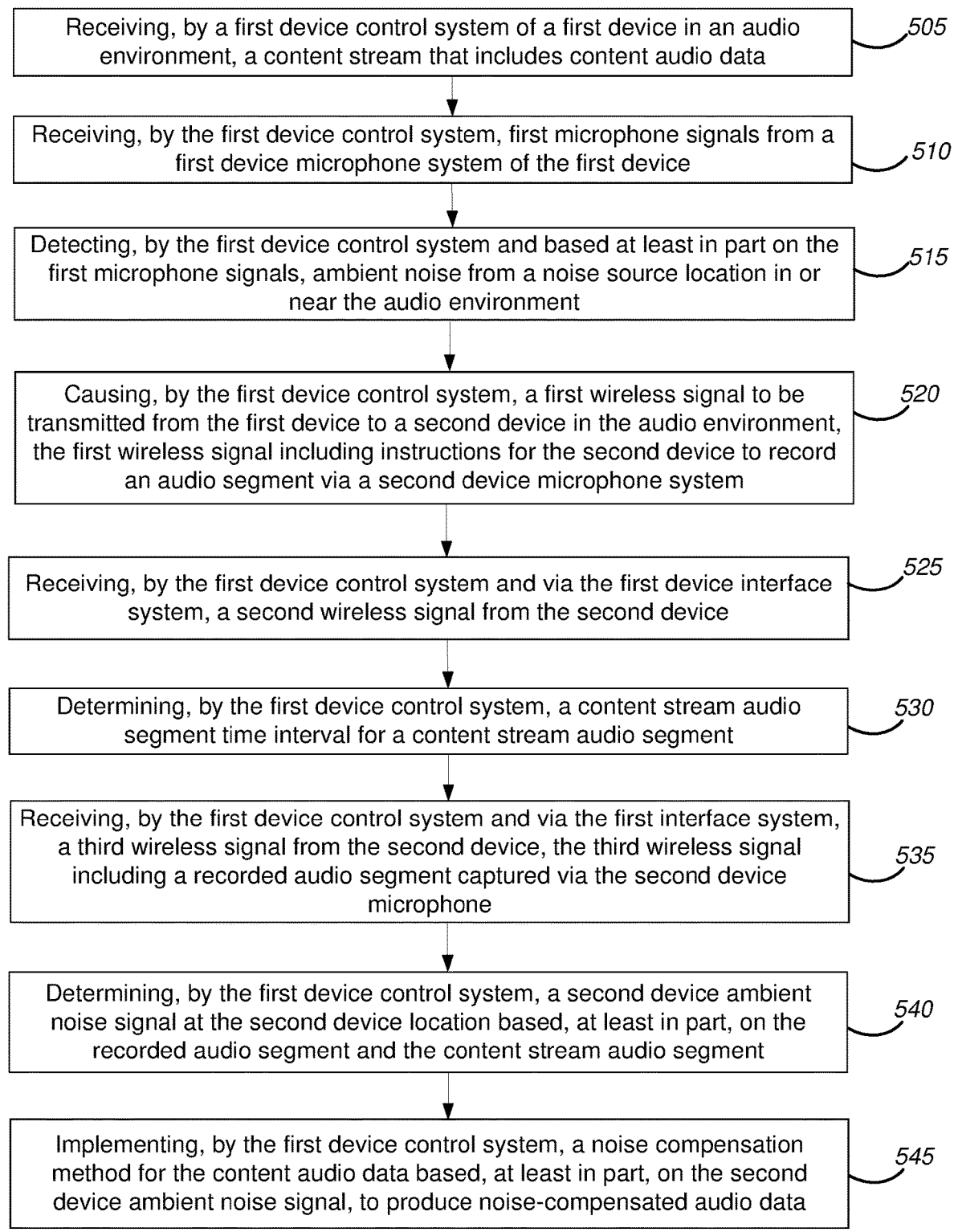
FIG. 5 is a flow diagram that outlines one example of a disclosed method.

FIG. 5 is a flow diagram that outlines one example of a disclosed method. The blocks of method 500, like other methods described herein, are not necessarily performed in the order indicated. Moreover, such methods may include more or fewer blocks than shown and/or described.

The method 500 may be performed by an apparatus or system, such as the apparatus 200 that is shown in FIG. 2 and described above. In some examples, the blocks of method 500 may be performed by one or more devices within an audio environment, e.g., an audio system controller or another component of an audio system, such as a smart speaker, a television, a television control module, a smart speaker, a mobile device, etc. In some implementations, the audio environment may include one or more rooms of a home environment. In other examples, the audio environment may be another type of environment, such as an office environment, an automobile environment, a train environment, a street or sidewalk environment, a park environment, etc. However, in alternative implementations at least some blocks of the method 500 may be performed by a device that implements a cloud-based service, such as a server.

In this implementation, block 505 involves receiving, by a first device control system and via a first interface system of a first device in an audio environment, a content stream that includes content audio data. According to some examples, the first device may be a television or a television control module. In some such examples, the content stream also may include content video data corresponding to the content audio data. However, in other examples the first device may be another type of device, such as a laptop computer, a smart speaker, a sound bar, etc.

In this example, block 510 involves receiving, by the first device control system and via the first interface system, first microphone signals from a first device microphone system of the first device. The first device microphone system may include one or more microphones. According to some examples in which the first device is a television or a television control module, the first microphone signals may be received from one or more microphone that are in, on or near a television, such as the television microphone 412 that is described above with reference to FIGS. 4A and 4B. According to this implementation, block 515 involves detecting, by the first device control system and based at least in part on the first microphone signals, ambient noise from a noise source location in or near the audio environment.

According to this example, block 520 involves causing, by the first device control system, a first wireless signal to be transmitted from the first device to a second device in the audio environment via the first interface system. In this example, the first wireless signal includes instructions for the second device to record an audio segment via a second device microphone system. In some implementations, the second device may be a remote control device, a smart phone or a smart speaker. According to some examples, the first wireless signal may be sent via radio waves or microwaves. In some examples block 520 may involve sending the signal 271, as described above with reference to FIG. 4C. According to this example, the first wireless signal is responsive to detecting the ambient noise in block 515. According to some examples, the first wireless signal may be responsive to determining that the detected ambient noise is greater than or equal to an ambient noise threshold level.

In some instances, the first wireless signal may include a second device audio recording start time or information for determining the second device audio recording start time. In some examples, information for determining the second device audio recording start time may include, or may be, instructions for waiting until a frequency hop occurs in cases in which the first wireless signal is transmitted via a frequency hopping system (e.g. Bluetooth). In some examples, information for determining the second device audio recording start time may include, or may be, instructions for waiting until a time slot is available in cases in which the first wireless signal is transmitted via a time division multiplexed wireless system. In some examples, the first wireless signal may indicate a second device audio recording time interval.

According to this example, block 525 involves receiving, by the first device control system and via the first interface system, a second wireless signal from the second device. According to some examples, the second wireless signal may be sent via infrared waves. In some examples block 525 may involve receiving the signal 265, as described above with reference to FIG. 4C. In some examples, the second wireless signal may indicate a second device audio recording start time. In some examples, the second wireless signal may indicate a second device audio recording time interval. According to some examples, the second wireless signal (or a subsequent signal from the second device) may indicate a second device audio recording end time. In some such examples, the method 500 may involve receiving, by the first device control system and via the first interface system, a fourth wireless signal from the second device, the fourth wireless signal indicating a second device audio recording end time.

In this example, block 530 involves determining, by the first device control system, a content stream audio segment time interval for a content stream audio segment. In some examples block 530 may involve determining the time interval for the content stream audio segment 269, as described above with reference to FIG. 4C. In some instances, the first device control system content stream may be configured to determine the audio segment time interval according to a second device audio recording start time and a second device audio recording end time, or according to a second device audio recording start time and a second device audio recording time interval. In some examples that involve receiving a fourth wireless signal from the second device indicating a second device audio recording end time, method 500 may involve determining a content stream audio segment end time based on the second device audio recording end time.

According to this example, block 535 involves receiving, by the first device control system and via the first interface system, a third wireless signal from the second device, the third wireless signal including a recorded audio segment captured via the second device microphone. In some examples block 535 may involve receiving the signal 266, as described above with reference to FIG. 4C.

In this example, block 540 involves determining, by the first device control system, a second device ambient noise signal at the second device location based, at least in part, on the recorded audio segment and the content stream audio segment. In some examples block 540 may involve performing an echo cancellation process based on the recorded audio segment and the content stream audio segment 269, in order to obtain an ambient noise signal 270 at the location of the remote control 417, as described above with reference to FIG. 4C.

According to this example, block 545 involves implementing, by the first device control system, a noise compensation method for the content audio data based, at least in part, on the second device ambient noise signal, to produce noise-compensated audio data. In some examples, method 500 may involve receiving, by the first device control system and via the first interface system, second microphone signals from the first device microphone system during a second device audio recording time interval. Some such examples may involve detecting, by the first device control system and based at least in part on the first microphone signals, a first device ambient noise signal corresponding to the ambient noise from the noise source location. In such examples, the noise compensation method may be based, at least in part, on the first device ambient noise signal.

According to some such examples, the noise compensation method may be based, at least in part, on a comparison of the first device ambient noise signal and the second device ambient noise signal. In some examples, the noise compensation method may be based, at least in part, on a ratio of the first device ambient noise signal and the second device ambient noise signal.

Some examples may involve providing (e.g., by the first device control system and via the first interface system) the noise-compensated audio data to one or more audio reproduction transducers of the audio environment. Some examples may involve rendering (e.g., by the first device control system) the noise-compensated audio data to produce rendered audio signals. Some such examples may involve providing (e.g., by the first device control system and via the first interface system) the rendered audio signals to at least some audio reproduction transducers of a set of audio reproduction transducers of the audio environment. In some such examples, at least one of the reproduction transducers of the audio environment may reside in the first device.

Figure 6:
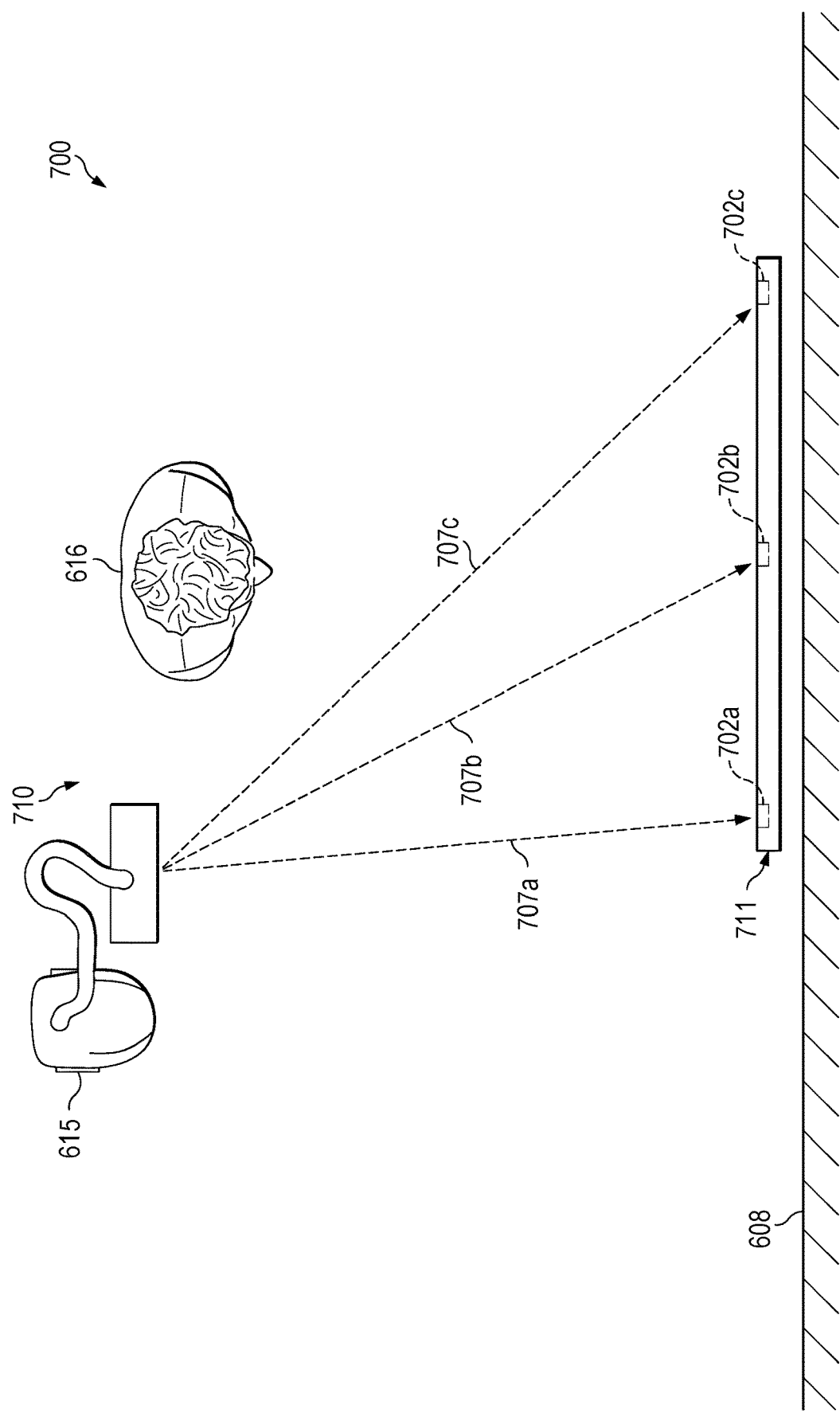
FIG. 6 shows an additional example of a noise compensation system.

FIG. 6 shows an additional example of a noise compensation system. In this example, FIG. 6 shows an example of a noise compensation system having three microphones, which allow a control system to determine the location of a noise source. In the example shown in FIG. 6, the noise compensation system 710 includes a television 711 and television microphones 702a, 702b and 702c. In some alternative examples, the noise compensation system 710 may include a remote control for the television 711, which may in some instances be configured to function like the remote control 417. Although not shown in FIG. 6, the noise compensation system includes a noise estimator and a noise compensator, which may be instances of the noise estimator 107 and a the noise compensator 102 that are described above with reference to FIG. 1A.

In some examples, the noise estimator 107 and the noise compensator 102 may be implemented via a control system, such as a control system of the television 611 (which may be an instance of the control system 210 that is described below with reference to FIG. 2), e.g., according to instructions stored on one or more non-transitory storage media. Similarly, the operations described with reference to FIGS. 6-7B may be via a control system of the television 611, via a control system of remote control, or via both control systems, depending on the particular implementation. In some implementations, the noise compensation methods that are described with reference to FIGS. 6-7B may be implemented via a control system of a device other than a television and/or a remote control device, such as a control system of another device having a display (e.g., a laptop computer), a control system of a smart speaker, a control system of a smart hub, a control system of another device of an audio system, etc.

In the examples shown in FIG. 6, the audio environment in which the noise compensation system 710 resides also includes a listener 616 (who is assumed to be stationary in this example) and a noise source 615. The location of the listener 616 may, in some examples, be presumed to be the same as, or in close proximity to, the location of a remote control. In this instance, the noise source 615 is closer to the listener 616 than the television 611. The type and location of the noise source 615 are merely shown by way of example.

Figure 7A:
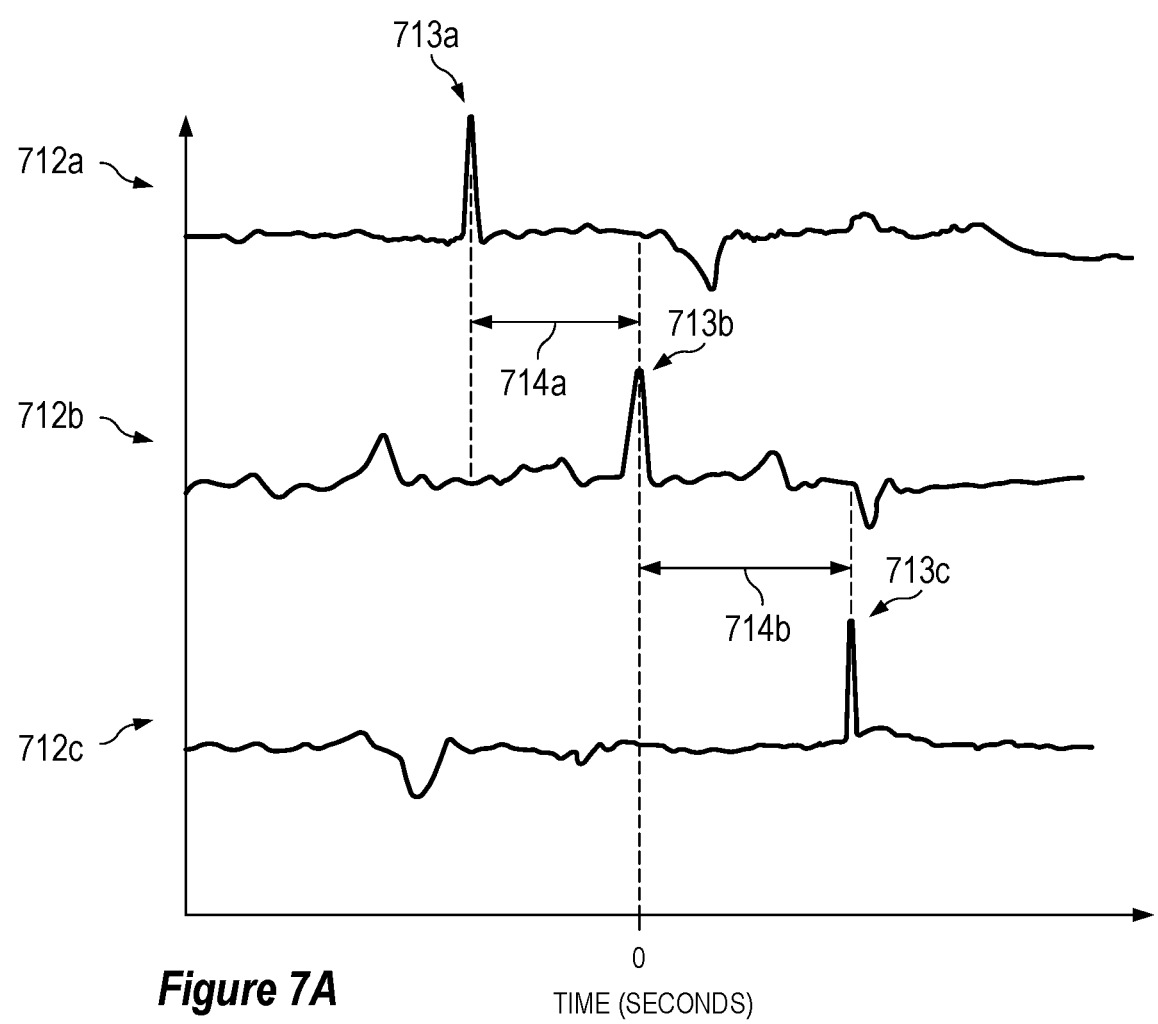
FIG. 7A is an example of a graph that indicates signals received by the microphones shown in FIG. 6.

As with other figures provided herein, the types, numbers and arrangements of elements shown in FIGS. 6-7A are merely provided by way of example. Other implementations may include more, fewer and/or different types, numbers or arrangements of elements, e.g., more loudspeakers and/or more microphones, more or fewer operations, etc.

FIG. 6 shows examples of acoustic propagation paths 707a, 707b and 707c from the noise source 615 to the microphones 702. In this example, the acoustic propagation paths 707a, 707b and 707c have different lengths and therefore different arrival times at each microphone. In the example shown in FIG. 67, no synchronization is required between the multiple devices, because the microphones 702a, 702b and 702c are part of the television 711 and are controlled by the same control system.

According to some examples, the cross-correlation function of the recorded ambient noise from the microphones 702a, 702b and 702c may be computed to determine the time difference of arrival between microphones. The path length difference is the time difference (seconds) multiplied by the speed of sound (meters per second). Based on the path length difference, the distance from the listener 616 to the television 711 and the known distance between the microphones 702a, 702b and 702c, the location of the noise source 615 can be solved. In some examples, the location of the noise source 615 may be calculated using a two-dimensional (2D) hyperbolic position location algorithm, such as one of the methods described in Chapter 1.21, 1.22, 2.1 or 2.2 of Dalskov, D., *Locating Acoustic Sources with Multilateration-Applied to Stationary and Moving Sources*, (Aalborg University, Jun. 4, 2014), which are hereby incorporated by reference. A specific example of one alternative solution is described below with reference to FIGS. 7A and 7B.

Figure 7B:
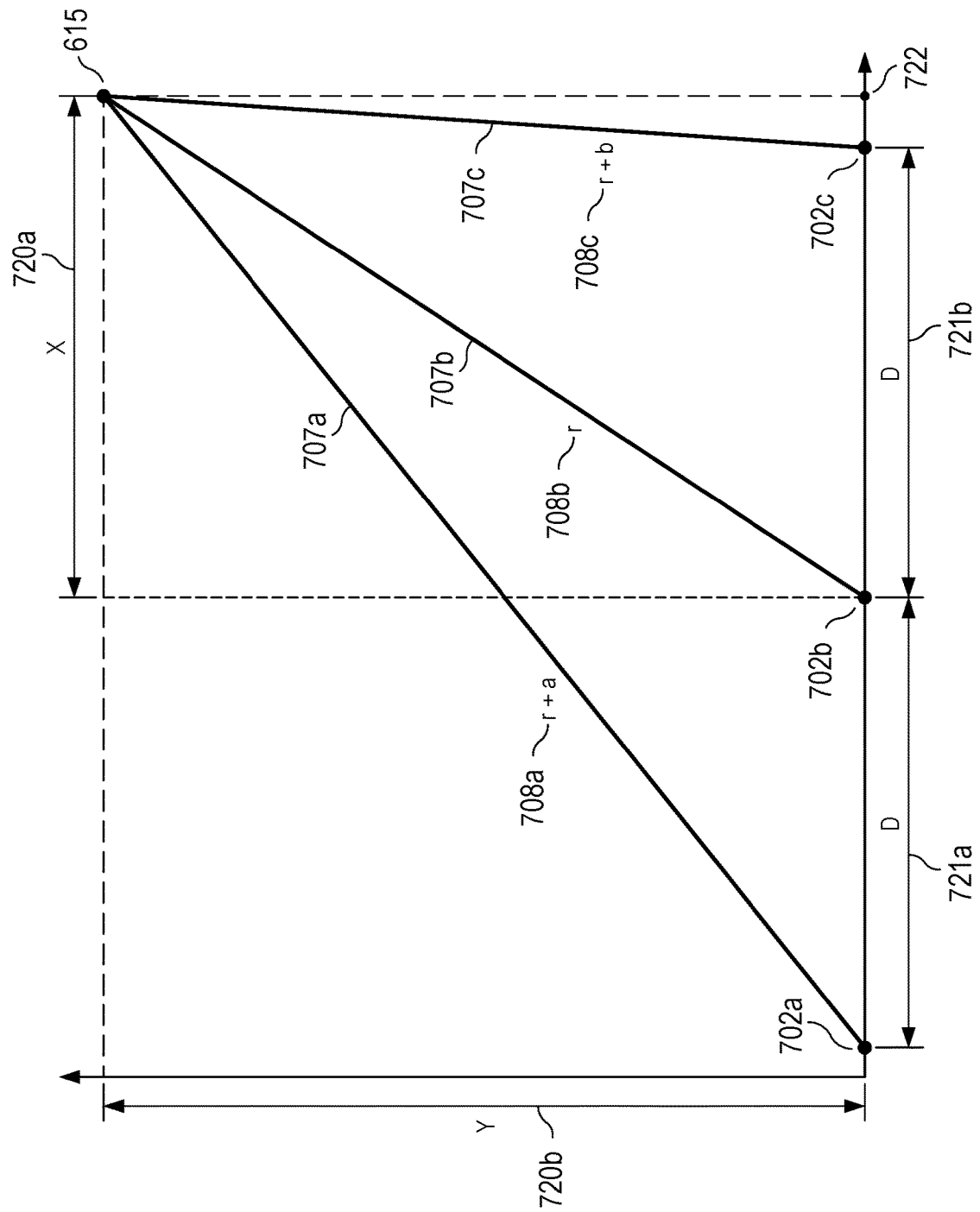
FIG. 7B shows the noise source of FIG. 6 in a different location of the audio environment.

FIG. 7A is an example of a graph that indicates signals received by the microphones shown in FIG. 6. In this example, FIG. 7A shows an example correlation analysis of the three microphones in order to determine the time difference of arrival (TDOA) of the noise source 615 at microphones 702a and 702c relative to central microphone 702b. According to this example, the elements of FIG. 7A are as follows:

712a represents the cross correlation of microphone 702a and reference microphone 702b;

712b represents the autocorrelation of reference microphone 702b;

712c represents the cross correlation of microphone 702c and reference microphone 702b;

713a is a peak in the cross correlation from which the TDOA of microphone 702a with respect to reference microphone 702b is determined. It can be seen in this example that sound arrives at microphone 702a before reference microphone 702b, yielding a negative TDOA for microphone 702a;

713b is a peak in the auto correlation of reference microphone 702b. In this example, we define time 0 to be the location of this peak. In some alternative embodiments, the autocorrelation function 712b can be deconvolved with the cross-correlation functions 712a and 712c prior to estimating TDOA in order to create sharper peaks;

713c is a peak in the cross correlation from which the TDOA of microphone 702c with respect to reference microphone 702b may be determined. It can be seen in this example that sound arrived at microphone 702c after reference microphone 702b, yielding a positive TDOA for microphone 702c;

714a is visual representation of the TDOA for microphone 702a with respect to reference microphone 702b. Mathematically we will treat TDOA 714a as a negative quantity in this example because sound arrives at microphone 702a before it arrives at microphone 702b; and 714b is a visual representation of the TDOA for microphone 702c with respect to reference microphone 702b. This TDOA will be a positive quantity in this example. FIG. 7B shows the noise source of FIG. 6 in a different location of the audio environment. In this example, the arrangement shown in FIG. 6 has been redrawn to emphasize the geometric nature of the problem and to label the lengths of the sides of each triangle. In this example, the noise source 615 is shown coming from the right of the diagram rather than the left as depicted in FIG. 6 and FIG. 7A. This is so that x coordinate of the noise source 720a is a positive quantity, to aid in clearly defining the coordinate system.

In the example shown in FIG. 7B, the elements are as follows:

615 represents the noise source to be located;

702a-c represent the locations of the three microphones shown in FIG. 6. Here, reference microphone 702b is shown to be the origin of a two-dimensional cartesian coordinate system;

720a represents the x coordinate (in metres) of the noise source 615 relative to the origin centred on reference microphone 702b;

720b represents the y coordinate (in metres) of the noise source 615 relative to the origin centred on reference microphone 702b;

721a represents the distance between microphone 702a and microphone 702b. In this example, microphone 702a is positioned on the television d metres to the left of reference microphone 702b. In one example, d=0.4 m;

721b represents the distance between microphone 702b and microphone 702c. In this example, microphone 702a is positioned on the television d metres to the right of reference microphone 702b;

722 represents the noise source 615 projected on the x axis of the cartesian coordinate system;

707a-c represent the acoustic path lengths (in metres) from the noise source 615 to each of the microphones 702a-c;

708b corresponds to the symbol r, which we define to mean the distance, in metres, from the noise source 615 to reference microphone 702b in this example;

708a corresponds to the sum of the symbols r+a. In this example, we define the symbol a to mean the path length difference between 707a and 707b, so that the length of acoustic path 707a is r+a. The acoustic path length r+a can be computed from the TDOA of microphone 702a with respect to microphone 702b (see 714a in FIG. 7A, which was negative in that example, but positive in this example) by multiplying the TDOA by the speed of sound in the medium. For example, if the TDOA 714a is +0.0007 s and the speed of sound is 343 metres/second, then a=0.2401 m;

708c corresponds to the sum of the symbols r+b. In this example, we define the symbol b to mean the path length difference between 707c and 707b, so that the length of acoustic path 707c is r+b. The acoustic path length r+b can be computed from the TDOA of microphone 702c with respect to microphone 702b (see 714c in FIG. 7A, which was positive in that example, but negative in this example) by multiplying the TDOA by the speed of sound in the medium. For example, if the TDOA 714c is −0.0006 s and the speed of sound is 343 metres/second, then b=−0.2058 m. In some implementations, a control system may be configured to determine a more precise speed of sound for the audio environment according to input from a temperature sensor.

We now write Pythagoras' Theorem for triangle (702b, 615, 722):

$$r^2 = x^2 + y^2 \qquad \text{Equation 2}$$

Pythagoras' Theorem for triangle (702a, 615, 722) may be written as follows:

$$(r+a)^2 = (x+d)^2 + y^2 \qquad \text{Equation 3}$$

Pythagoras' Theorem for triangle (702c, 615, 722) may be written as follows:

$$(r+b)^2 = (x-d)^2 + y^2 \qquad \text{Equation 4}$$

Together, Equations 2, 3 and 4 form a system of three simultaneous equations in unknowns r, x, y. We are particularly interested to know r, the distance in metres from the noise source to reference microphone 702b.

This system of equations may be solved for r as follows:

$$r = -(a^2 + b^2 - 2d^2)/(2(a+b)) \qquad \text{Equation 5}$$

For the example values given above:

$$a = 0.2401 \text{ m}, \; b = -0.2058 \text{ m}, \; d = 0.4 \text{ m}$$

we can conclude that r=3.206 m. Therefore, the noise source 615 lies approximately 3.2 m from the reference microphone 702b in this example.

In addition to estimating a noise source location, some implementations may involve determining or estimating a listener position. Referring again to FIG. 6, the distance from the listener 616 to the television 611 may be estimated or determined in different ways, depending on the particular implementation. According to some examples, the distance from the listener 616 to the television 611 may be determined during an initial setup of the television 611 by the listener 616 or by another user. In other examples, the location of the listener 161 and/or the distance from the listener 616 to the television 611 may be determined according to input from one or more sensors, e.g., according to input from one or more cameras, according to input from additional microphones or according to input from other sensors of the sensor system 230 that is described above with reference to FIG. 2. In other examples, in the absence of user input or sensor input, the distance from the listener 616 to the television 611 may be determined according to a default distance, which may be an average distance from a typical listener to a television. In some examples, it may be assumed that the listener is within a certain angle from a normal to the television screen, e.g., within 10 degrees, within 15 degrees, within 20 degrees, within 25 degrees, within 30 degrees, etc.

According to some implementations, a noise compensation may be based, at least in part, on a determined or estimated listener location and a determined or estimated noise source location. For example, by knowing where the listener 616 is (or assuming where the listener 616 is relative to the television 711) and knowing the location of the noise source 615 and the corresponding noise level at the television 711, a noise estimate for the location of the listener 616 can be calculated using a propagation loss model. This predicted noise compensation value for the listener's location may be used directly by a noise compensation system.

In some alternative implementations, the predicted noise level at the listener position may be further modified to include a confidence value. For example, if the noise source is relatively far away the listener position (or from a plurality of the most likely listener positions and doesn't have a large variation in the predicted noise estimates between the most likely listener positions), then the noise estimate will have a high confidence. Otherwise the noise estimate may have a lower confidence. The list of likely listener positions may change depending on the context of the system. Furthermore, according to some examples the noise estimate confidence can be further augmented if there are multiple microphones measuring the noise level, potentially at various locations of the audio environment. If the measured noise levels at various locations of the audio environment are all consistent with the propagation loss model, this can provide a higher confidence for the noise estimate than if the measured noise levels at the various locations are inconsistent with the propagation loss model.

If the noise compensation system has a high confidence in the noise estimate for the listener location, in some implementations the noise compensation system may be configured to implement an unconstrained noise compensation method. Alternatively the noise compensation system may implement a more constrained noise compensation method if the noise compensation system has a low confidence in the noise estimate for the listener location.

Figure 8:
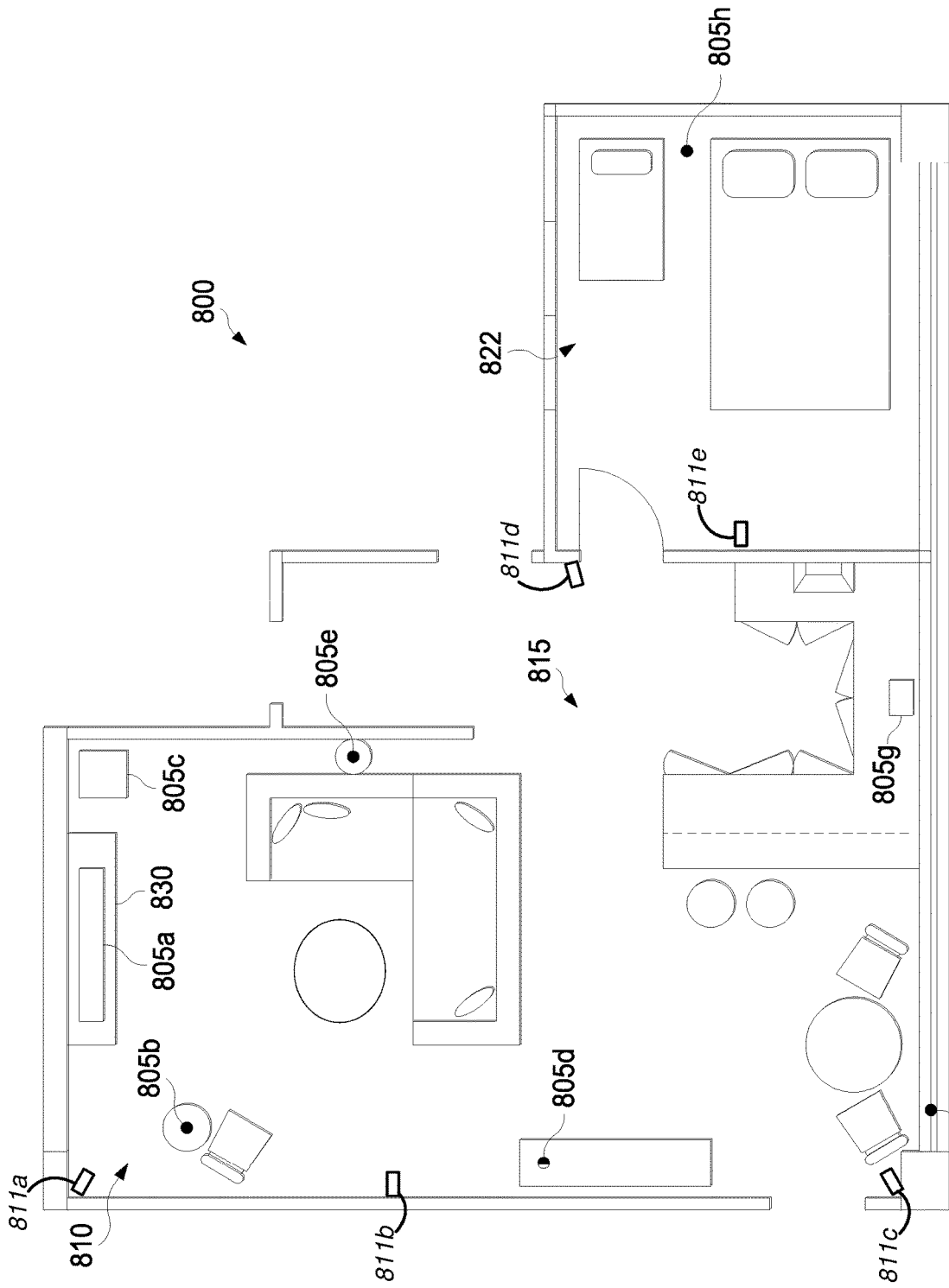
FIG. 8 shows an example of a floor plan of an audio environment, which is a living space in this example.

FIG. 8 shows an example of a floor plan of an audio environment, which is a living space in this example. As with other figures provided herein, the types, numbers and arrangements of elements shown in FIG. 8 are merely provided by way of example. Other implementations may include more, fewer and/or different types, numbers or arrangements of elements.

According to this example, the environment 800 includes a living room 810 at the upper left, a kitchen 815 at the lower center, and a bedroom 822 at the lower right. Boxes and circles distributed across the living space represent a set of loudspeakers 805*a*-805*h*, at least some of which may be smart speakers in some implementations, placed in locations convenient to the space, but not adhering to any standard prescribed layout (arbitrarily placed). In some examples, the television 830 may be configured to implement one or more disclosed embodiments, at least in part. In this example, the environment 800 includes cameras 811*a*-811*e*, which are distributed throughout the environment. In some implementations, one or more smart audio devices in the environment 800 also may include one or more cameras. The one or more smart audio devices may be single purpose audio devices or virtual assistants. In some such examples, one or more cameras of the optional sensor system 130 may reside in or on the television 830, in a mobile phone or in a smart speaker, such as one or more of the loudspeakers 805*b*, 805*d*, 805*e* or 805*h*. Although cameras 811*a*-811*e* are not shown in every depiction of the environment 800 presented in this disclosure, each of the environments 800 may nonetheless include one or more cameras in some implementations.

Some aspects of present disclosure include a system or device configured (e.g., programmed) to perform one or more examples of the disclosed methods, and a tangible computer readable medium (e.g., a disc) which stores code for implementing one or more examples of the disclosed methods or steps thereof. For example, some disclosed systems can be or include a programmable general purpose processor, digital signal processor, or microprocessor, programmed with software or firmware and/or otherwise configured to perform any of a variety of operations on data, including an embodiment of disclosed methods or steps thereof. Such a general purpose processor may be or include a computer system including an input device, a memory, and a processing subsystem that is programmed (and/or otherwise configured) to perform one or more examples of the disclosed methods (or steps thereof) in response to data asserted thereto.

Some embodiments may be implemented as a configurable (e.g., programmable) digital signal processor (DSP) that is configured (e.g., programmed and otherwise configured) to perform required processing on audio signal(s), including performance of one or more examples of the disclosed methods. Alternatively, embodiments of the disclosed systems (or elements thereof) may be implemented as a general purpose processor (e.g., a personal computer (PC) or other computer system or microprocessor, which may include an input device and a memory) which is programmed with software or firmware and/or otherwise configured to perform any of a variety of operations including one or more examples of the disclosed methods. Alternatively, elements of some embodiments of the inventive system are implemented as a general purpose processor or DSP configured (e.g., programmed) to perform one or more examples of the disclosed methods, and the system also includes other elements (e.g., one or more loudspeakers and/or one or more microphones). A general purpose processor configured to perform one or more examples of the disclosed methods may be coupled to an input device (e.g., a mouse and/or a keyboard), a memory, and a display device.

Another aspect of present disclosure is a computer readable medium (for example, a disc or other tangible storage medium) which stores code for performing (e.g., coder executable to perform) one or more examples of the disclosed methods or steps thereof.

While specific embodiments of the present disclosure and applications of the disclosure have been described herein, it will be apparent to those of ordinary skill in the art that many variations on the embodiments and applications described herein are possible without departing from the scope of the disclosure described and claimed herein. It should be understood that while certain forms of the disclosure have been shown and described, the disclosure is not to be limited to the specific embodiments described and shown or the specific methods described.

The invention claimed is:

1. A noise compensation method, comprising:
   receiving, by a control system and via an interface system, microphone signals corresponding to ambient noise from a noise source location in or near an audio environment;
   determining or estimating, by the control system, a listener position in the audio environment;
   estimating, by the control system, at least one critical distance, a critical distance being a distance from the noise source location at which directly propagated sound pressure of ambient noise from the noise source is equal to diffuse field sound pressure of ambient noise from the noise source;
   estimating whether the listener position is within the at least one critical distance from the noise source location; and
   implementing a noise compensation method for the ambient noise based, at least in part, on at least one estimate of whether the listener position is within the at least one critical distance from the noise source location.

2. The noise compensation method of claim 1, further comprising:
   controlling, via the control system, an audio reproduction transducer system in an audio environment to reproduce one or more room calibration sounds, the audio reproduction transducer system including one or more audio reproduction transducers;
   receiving, by the control system and via the interface system, microphone signals corresponding to the audio environment's response to the one or more room calibration sounds;
   determining, by the control system and based on the microphone signals, a reverberation time for each of a plurality of frequencies; and
   determining or estimating an audio environment volume of the audio environment,
   wherein estimating the at least one critical distance involves calculating, based at least in part on the plurality of frequency-dependent reverberation times and the audio environment volume, a plurality of estimated frequency-based critical distances, each estimated frequency-based critical distance of the plurality of estimated frequency-based critical distances corresponding to a frequency of the plurality of frequencies.

3. The noise compensation method of claim 2, wherein estimating whether the listener position is within the at least one critical distance involves estimating whether the listener position is within each frequency-based critical distance of the plurality of frequency-based critical distances.

4. The noise compensation method of claim 3, further comprising transforming the microphone signals corresponding to the ambient noise from a time domain into a frequency domain and determining a frequency band ambient noise level estimate for each of a plurality of ambient noise frequency bands.

5. The noise compensation method of claim 4, further comprising determining a frequency-based confidence level for each of the frequency band ambient noise level estimates.

6. The noise compensation method of claim 5, wherein each frequency-based confidence level corresponds to an estimate of whether the listener position is within each frequency-based critical distance.

7. The noise compensation method of claim 5, wherein each frequency-based confidence level is inversely proportional to each frequency-based critical distance.

8. The noise compensation method of claim 5, wherein implementing the noise compensation method involves implementing a frequency-based noise compensation method based on the frequency-based confidence level for each ambient noise frequency band.

9. The noise compensation method of claim 8, wherein the frequency-based noise compensation method involves applying a default noise compensation method for each ambient noise frequency band for which the confidence level is at or above a threshold confidence level.

10. The noise compensation method of claim 8, wherein the frequency-based noise compensation method involves modifying a default noise compensation method for each ambient noise frequency band for which the confidence level is below a threshold confidence level.

11. The noise compensation method of claim 10, wherein modifying the default noise compensation method involves reducing a default noise compensation level adjustment.

12. The noise compensation method of claim 2, wherein the one or more room calibration sounds are embedded in content audio data received by the control system.

13. The noise compensation method of claim 1, further comprising receiving, by the control system and via the interface system, a content stream that includes audio data, wherein implementing the noise compensation method involves applying the noise compensation method to the audio data to produce noise-compensated audio data.

14. The noise compensation method of claim 1, further comprising providing, by the control system and via the interface system, the noise-compensated audio data to one or more audio reproduction transducers of the audio environment.

15. The noise compensation method of claim 1, further comprising:
   rendering, by the control system, the noise-compensated audio data to produce rendered audio signals; and
   providing, by the control system and via the interface system, the rendered audio signals to at least some audio reproduction transducers of a set of audio reproduction transducers of the audio environment.

16. An apparatus configured to implement the noise compensation method of claim 1.

17. One or more non-transitory media having software stored thereon, the software including instructions for controlling one or more devices to implement the noise compensation method of claim 1.

18. A system configured to implement the noise compensation method of claim 1.

* * * * *